United States Patent
Kuwabara et al.

(10) Patent No.: US 7,579,224 B2
(45) Date of Patent: Aug. 25, 2009

(54) METHOD FOR MANUFACTURING A THIN FILM SEMICONDUCTOR DEVICE

(75) Inventors: Hideaki Kuwabara, Kanagawa (JP); Hiroko Yamamoto, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 316 days.

(21) Appl. No.: 11/329,095

(22) Filed: Jan. 11, 2006

(65) Prior Publication Data

US 2006/0163743 A1    Jul. 27, 2006

(30) Foreign Application Priority Data

Jan. 21, 2005   (JP)   ............... 2005-014756

(51) Int. Cl.
H01L 21/00   (2006.01)
H01L 21/84   (2006.01)
H01L 21/3205 (2006.01)
H01L 21/44   (2006.01)

(52) U.S. Cl. ............ 438/151; 438/149; 438/586; 438/610

(58) Field of Classification Search ........... 438/151, 438/149, 585–586, 610
See application file for complete search history.

(56) References Cited

U.S. PATENT DOCUMENTS

| | | | |
|---|---|---|---|
| 4,861,964 A | 8/1989 | Sinohara | |
| 4,970,368 A * | 11/1990 | Yamazaki et al. | 219/121.85 |
| 5,708,252 A | 1/1998 | Shinohara et al. | |
| 6,149,988 A | 11/2000 | Shinohara et al. | |
| 6,309,957 B1 | 10/2001 | Tu et al. | |
| 6,376,353 B1 | 4/2002 | Zhou et al. | |
| 6,399,486 B1 | 6/2002 | Chen et al. | |
| 6,429,118 B1 | 8/2002 | Chen et al. | |
| 6,492,708 B2 | 12/2002 | Acosta et al. | |

(Continued)

FOREIGN PATENT DOCUMENTS

JP    59-169154    9/1984

(Continued)

OTHER PUBLICATIONS

Office Action dated Jul. 11, 2008 in Chinese Counterpart Appln. No. 200610006407.0 with English translation.

(Continued)

*Primary Examiner*—Shouxiang Hu
(74) *Attorney, Agent, or Firm*—Nixon Peabody LLP; Jeffrey L. Costellia

(57) ABSTRACT

It is an object of the present invention to simplify steps needed to process a wiring in forming a multilayer wiring. In addition, when a droplet discharging technique or a nanoimprint technique is used to form a wiring in a contact hole having a comparatively long diameter, the wiring in accordance with the shape of the contact hole is formed, and the wiring portion of the contact hole is likely to have a depression compared with other portions. A penetrating opening is formed by irradiating a light-transmitting insulating film with laser light having high intensity and a pulse high in repetition frequency. A plurality of openings having a minute contact area is provided instead of forming one penetrating opening having a large contact area to have an even thickness of a wiring by reducing a partial depression and also to ensure contact resistance.

12 Claims, 19 Drawing Sheets

U.S. PATENT DOCUMENTS

| | | | |
|---|---|---|---|
| 6,514,855 | B1 | 2/2003 | Suzuki et al. |
| 6,720,230 | B2 | 4/2004 | Acosta et al. |
| 6,753,249 | B1 | 6/2004 | Chen et al. |
| 6,885,146 | B2 | 4/2005 | Yamazaki et al. |
| 6,897,433 | B2 | 5/2005 | Itoh et al. |
| 6,946,381 | B2 | 9/2005 | Hwang |
| 7,176,069 | B2 * | 2/2007 | Yamazaki et al. ............ 438/149 |
| 7,208,764 | B2 * | 4/2007 | Furusawa ..................... 257/72 |
| 7,356,921 | B2 | 4/2008 | Furusawa et al. |
| 7,371,286 | B2 * | 5/2008 | Wakabayashi .............. 118/722 |
| 7,404,990 | B2 | 7/2008 | Lukas et al. |
| 2002/0130386 | A1 | 9/2002 | Acosta et al. |
| 2003/0173890 | A1 * | 9/2003 | Yamazaki et al. ........... 313/498 |
| 2004/0096593 | A1 | 5/2004 | Lukas et al. |
| 2004/0137241 | A1 | 7/2004 | Lin et al. |
| 2005/0127035 | A1 | 6/2005 | Ling |
| 2005/0191847 | A1 | 9/2005 | Misawa et al. |
| 2006/0113671 | A1 | 6/2006 | Isa et al. |
| 2006/0115983 | A1 | 6/2006 | Fujii et al. |
| 2006/0116000 | A1 | 6/2006 | Yamamoto |
| 2006/0163743 | A1 | 7/2006 | Kuwabara et al. |
| 2006/0170067 | A1 | 8/2006 | Maekawa et al. |
| 2007/0072439 | A1 | 3/2007 | Akimoto et al. |
| 2007/0178672 | A1 | 8/2007 | Tanaka et al. |
| 2008/0308796 | A1 | 12/2008 | Akimoto et al. |
| 2008/0308797 | A1 | 12/2008 | Akimoto et al. |
| 2008/0308804 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |

FOREIGN PATENT DOCUMENTS

| | | |
|---|---|---|
| JP | 2004-305990 | 11/2004 |

OTHER PUBLICATIONS

"Introduction of porous low-k has begun a full-scale It has started with a spin coating method", Nikkei Microdevices, No. 233, Nov. 2004, pp. 58-65, with English translation.

* cited by examiner

METHOD FOR MANUFACTURING A THIN FILM SEMICONDUCTOR DEVICE

BACKGROUND OF THE INVENTION

1. Field of the Invention

The present invention relates to a semiconductor device having a circuit including a thin film transistor (hereinafter, referred to as a TFT) and to a manufacturing method thereof. Specifically, the present invention relates to a semiconductor device having a circuit including a field effect transistor (hereinafter, referred to as an FET). For example, the present invention relates to an electronic device incorporating, as part thereof, a large-scale integrated circuit (LSI), an electro-optic device typified by a liquid crystal display panel, a light-emitting display device having an organic light-emitting element, a sensor device such as a line sensor, or a memory device such as an SRAM or a DRAM, for example.

2. Description of the Related Art

Note that a semiconductor device in this specification means general devices and apparatuses that can function with the use of semiconductor characteristics; for example, an electro-optical device, a semiconductor circuit, and an electronic device are all included in a semiconductor device.

In recent years, in the case of forming a multilayer wiring in a semiconductor element, irregularities are more significant in upper layers, and the wirings are difficult to be processed. Correspondingly, a wiring material is generally embedded in a wiring opening such as a wiring trench or a hole formed in an insulating film by a wiring formation technology called a damascene process.

A damascene process is a method in which a trench is first formed in an insulating film, the entire surface is covered with a metal material (filling the trench), and the entire surface is polished by a CMP (chemical mechanical polishing) method or the like to form a metal wiring. The method further including a step of providing a hole below a metal wiring for contact with a metal wiring or a semiconductor region in a lower wiring is called a dual damascene process. The dual damascene process includes a step in which, after forming a hole for a connection with a lower layer wiring and a wiring trench are formed, a wiring material is deposited, and the wiring material except the wiring portion is removed by a CMP method.

For a metal wiring using a dual damascene process, copper (Cu) by an electroplating method is commonly used. In the electroplating method, a plating solution or the electric field to be applied is required to be controlled intricately so that copper (Cu) is completely embedded in the connection hole. In addition, it is difficult to process copper (Cu) by an etching process using an etchant or an etching gas; therefore, a special CMP method is required for polishing for copper (Cu) processing.

An electroplating method and a CMP method have had a problem of increase in manufacturing costs for forming a wiring.

In addition, not only in a manufacturing process of a semiconductor device using a semiconductor substrate but also in a manufacturing process of an active matrix substrate using a thin film transistor (TFT), it is difficult to process a wiring in forming a multilayer wiring. In recent years, a thin film transistor is widely applied to an electronic device such as an IC or an electro-optic device, and is particularly developed as switching elements for image display devices at a rapid rate. Note that a liquid crystal display device is generally well known as an image display device.

An active matrix liquid crystal display device has often been used because a high precision image can be obtained compared with a passive liquid crystal display device. In the active matrix liquid crystal display device, pixel electrodes arranged in matrix are driven to display an image pattern on the screen. Specifically, a voltage is applied to a selected pixel electrode and an opposite electrode corresponding to the pixel electrode, and thus, a liquid crystal layer between the pixel electrode and the opposite electrode is modulated optically. The optical modulation can be recognized as an image pattern by an observer.

Application range of such an active matrix liquid crystal display device is expanding, and demands for the improvement of productivity and cost reduction are increasing, as a display size gets larger.

Conventionally, in the case of forming a multilayer wiring, in order to connect the upper wiring and the lower wiring, a contact hole is formed in an interlayer insulating film between these wirings by using a photolithography method. In the case of forming a contact hole by using a photolithography method, various steps such as forming a resist mask (coating, exposing, and developing a resist), etching selectively, or removing a resist mask are necessary. In other words, it is necessary to form a contact hole to have a multilayer structure so that the plurality of wirings cross to each other, which has been one of causes of increase in the number of manufacturing processes.

In addition, in the case of using a photolithography method, a photomask is also necessary for each exposure pattern; therefore, a cost for manufacturing the photomask is increased, which has been one of causes of increase in a manufacturing cost.

Moreover, in the case of using a photolithography method, large quantities of resist materials and developing solutions are used in order to improve uniformity; thus, a great deal of surplus materials is consumed.

As for a method for etching an interlayer insulating film selectively, dry etching and wet etching are known. Generally, dry etching by gas plasma has an advantage in forming a pattern processed into a tapered shape or the like. However, a dry-etching apparatus is disadvantageous in that an expensive large-scaled apparatus is needed and a manufacturing cost is increased. In addition, there is a fear that a semiconductor element is damaged due to gas plasma. Therefore, it is desirable that dry etching is performed as less as possible.

In addition, wet etching which is inexpensive and superior in terms of mass production compared with dry etching uses a great deal of etchant once; therefore, waste fluid treatment is difficult, which has been one of causes of increase in a manufacturing cost. In addition, since wet etching is isotropic etching, it is difficult to form a contact hole having comparatively small diameter, which is disadvantageous in high integration of a circuit.

As for a method without using a photoresist in processing a thin film by patterning, a laser-processing technique, particularly a laser-processing method using YAG laser light (wavelength of 1.06 μm) is known. In the laser-processing method with the use of YAG laser light, as well as an object to be processed is irradiated with a spot-like beam, the beam is scanned into a processing direction to form an opening into a chain shape of continuous dots.

In addition, the present applicant uses laser light having a wavelength of 400 μm or less to irradiate a light-transmitting conductive film with a linear beam. A method for processing a thin film for forming an opening is described in Reference 1:

U.S. Pat. No. 4,861,964 Specification, Reference 2: U.S. Pat. No. 5,708,252 Specification, and Reference 3: U.S. Pat. No. 6,149,988 Specification.

SUMMARY OF THE INVENTION

It is an object of the present invention to simplify steps needed to process a wiring in forming a multilayer wiring. Further, it is an object of the present invention to provide a technique to realize high integration of a circuit.

In addition, in the case of forming a plurality of contact holes different in depth, a process tends to be complicated. Consequently, the present invention provides a technique capable of realizing a plurality of contact holes different in depth in a simplified process.

Moreover, in manufacturing an electronic device having a semiconductor circuit, a gang printing that is a manufacturing method of cutting out a plurality of devices from one mother glass substrate for mass production efficiently is employed without using a wafer substrate. The size of a mother glass substrate is increased from 300 mm×400 mm of the first generation in the early 1990s to 680 mm×880 mm or 730 mm×920 mm of the fourth generation in 2000. Further, the manufacturing technique has been developed so that a large number of devices, typically, display panels can be obtained from one substrate.

In forming a metal film to be a wiring by a deposition method with the use of a sputtering method when the substrate size is further increased hereafter, a target becomes expensive as the size is increased, which is disadvantageous for mass production.

In addition, in consideration of mass production, it is also an object of the present invention to provide a technique to form a wiring appropriate for a large-sized substrate.

According to the present invention, a light-transmitting insulating film that is formed to cover a conductive layer is selectively irradiated with laser light to form a penetrating opening that reaches the conductive layer. A step of forming a contact hole can be simplified by forming a penetrating opening in a light-transmitting insulating film by laser light.

In addition, a focal position of laser light is appropriately determined by a practitioner. Therefore, the depth of a penetrating opening or the size of a penetrating opening can be decided appropriately. Thus, according to the present invention, a plurality of contact holes different in depth can be realized in a simplified process. Moreover, the light-transmitting insulating film is not limited to a single layer, and a step of forming a contact hole can be simplified even in a stacked layer of two or more layers.

According to laser light of the present invention, a fundamental wave is used without putting laser light into a non-linear optical element, and a penetrating opening is formed by irradiating a light-transmitting insulating film with pulsed laser light having high intensity and a high repetition rate. One feature of the present invention is that the repetition rate of laser used in the present invention is set to be 10 MHz or more.

High intensity means a high peak output power per unit of time and per area and the peak output power of laser light according to the present invention ranges from 1 GW/cm$^2$ to 1 TW/cm$^2$.

A fundamental wave with a wavelength of approximately 1 μm is not absorbed so much by a light-transmitting insulating film in irradiating the light-transmitting insulating film with the fundamental wave. Thus, the fundamental wave has low absorption efficiency. A fundamental wave emitted from a pulsed laser having a pulse width in the range of picosecond or in the range of femtosecond ($10^{-15}$ seconds) can provide high intensity laser light. Thus, a non-linear optical effect (multi-photon absorption) is generated and the fundamental wave can be absorbed by light-transmitting insulating film to form a penetrating opening.

Additionally, a shape of an opening in a plane perpendicular to a substrate can be determined appropriately by a practitioner appropriately determining a focal position of laser light. For example, an opening the opening area on a surface of a light-transmitting insulating film of which is smaller than an exposed area of a conductive layer can be formed.

In a conventional processing method using YAG laser light, a beam shape is circular and light intensity shows a Gaussian distribution; therefore, an opening shape in a plane perpendicular to a surface of an object to be processed has a shape in accordance with a Gaussian distribution. Thus, in the conventional processing method using YAG laser light, an opening on a surface is likely to increase in size, and it is difficult to form a deep contact hole having a minute opening size. In addition, a pulse width that is used in the conventional processing method using YAG laser light is $10^{-4}$ second to $10^{-2}$ second.

In addition, in a conventional processing method, where a light-transmitting conductive film is irradiated with a linear beam to form an opening with the use of laser light having a wavelength of 400 μm or less, an opening is formed from the surface of the light-transmitting conductive film because the light-transmitting conductive film that absorbs laser light having a wavelength of 400 μm or less is used. A surface easily absorbs energy also in this processing method; thus, an opening diameter on the surface gets longer easily.

Compared with the conventional processing method, a processing method according to the present invention is not limited to forming an opening penetrating from a surface, and various formation methods are available. For example, when a light-transmitting insulating film is irradiated with laser light while moving a focal position of the laser light from a conductive layer side to a surface, an opening penetrating from the conductive layer side to a surface is formed in the light-transmitting insulating film. In addition, it is also possible to form an opening in an insulating film by being irradiated with laser light to penetrate through a light-transmitting substrate from a backside, that is, the substrate side.

In addition, according to the present invention, an opening having a complicated shape can also be formed by freely moving a focal position of laser light. For example, an opening penetrating in a vertical direction is formed in a Z direction (depth direction) and then a hole in a lateral direction is formed in an X direction or a Y direction.

Further, it is also one feature of the present invention to use a printing technique such as a droplet discharging technique typified by a piezo type and a thermal jet type or a nanoimprint technique to form a wiring or an electrode in a position overlapped with an opening of an insulating film and to electrically connect to a conductive layer through the opening of the insulating film.

For example, in the case of using a droplet discharging technique, a conductive material where a material solution is adjusted and dropped can have fluidity; therefore, even an opening having a crooked complicated shape can be filled with the conductive material. For example, even a hole where the side wall is in a reverse tapered shape can be filled with the conductive material. In addition, a deep opening or an opening having a complicated shape can be filled with the conductive material by making the most of speed of a conductive material that is dropped using a droplet discharging technique. Moreover, it is also one feature of the present invention to provide an opening filled with the conductive material having fluidity is easily filled.

In addition, in the case of using a printing technique such as a nanoimprint technique, it is also possible to fill an opening having a complicated shape by giving fluidity to the conductive material with a conductive material in performing heat treatment for baking.

Moreover, when a wiring is formed with the use of a droplet discharging technique or a nanoimprint technique in a contact hole having a comparatively long diameter, for example, a diameter longer than 2 μm, the wiring in accordance with the shape of the contact hole is formed, and the wiring portion of the contact hole is likely to have a depression compared with other portions. FIGS. 19A to 19C each shows a state in which a conventional contact hole is formed. A base insulating film 3011 is provided over a substrate 3010, and a conductive layer 3012 is provided over the base insulating film 3011. In FIG. 19A, an insulating film is formed over the conductive layer 3012, a resist mask 3014 is formed by a photolithography technique, and an opening 3016 is formed by etching. Then, by removing the resist mask 3014 and forming a wiring with the use of a droplet discharging technique or a nanoimprint technique, a wiring 3017a as shown in FIG. 19B is formed. As shown in FIG. 19B, the wiring 3017a is a wiring in accordance with the shape of the contact hole and the wiring portion of the contact hole has a depression compared with other portions. Further, when baking is performed, the wiring 3017a is transformed into a wiring 3017b as shown in FIG. 19C because the wiring material has fluidity. Thus, the wiring material moves to a material movement direction 3018 shown in an arrow in FIG. 19C and there is a fear that the thickness of the wiring in vicinity of the contact hole becomes thinner compared with other portions. In addition, in the case of using a material having low viscosity and fluidity in a droplet discharging technique, the material of a wiring tends to move to a lower place before baking, that is, just after forming the wiring.

Thus, it is also one feature of the present invention to provide a plurality of openings having a minute contact area the diameter of which is 2 μm or less, preferably approximately 3 nm to 200 nm, instead of forming one penetrating opening having a large contact area to have an even thickness of a wiring by reducing a partial depression and also to ensure contact resistance.

According to one feature of the present invention disclosed in this specification, the example of which is shown in FIG. 1C, a semiconductor device comprises a first conductive layer; a plurality of penetrating openings (also referred to as a plurality of openings); an insulating film covering the first conductive layer; and a second conductive layer in contact with the first conductive layer through the plurality of penetrating openings, wherein the second conductive layer contains conductive particles, and wherein a surface of the second conductive layer which is overlapped with the plurality of penetrating openings and a surface of the second conductive layer which is not overlapped with the plurality of penetrating openings are formed in one side. In other words, the second conductive layer is leveled. The width of the second conductive layer D and a diameter of each of the plurality of openings W satisfy 2D<W.

In addition, according to the above feature, the second conductive layer has a plurality of crystals where the conductive particles are assembled and the crystals are overlapped. When a wiring is formed with a conductive material containing metal particles of 3 nm to 7 nm in size by a droplet discharging method or a printing method and is baked, the metal particles are dissolved and assembled to have an approximately 100 nm crystal, which is formed to irregularly overlap in three dimensions.

According to another feature of the present invention, a diameter of a penetrating opening is longer than one conductive particle. The opening has a diameter longer than a diameter of the metal particles to be used (3 nm to 7 nm) so that at least the metal particles enter the opening on the surface. Specifically, a diameter of a penetrating opening according to the present invention is 3 nm to 2000 nm.

In addition, the present invention is not limited to the opening in contact with the lower conductive layer. According to another feature of the present invention, a semiconductor device comprises a semiconductor layer; a plurality of penetrating openings; an insulating film covering the semiconductor layer; and a conductive layer in contact with the semiconductor layer through the plurality of penetrating openings, wherein the conductive layer contains conductive particles, and wherein a surface of the conductive layer which is overlapped with the plurality of penetrating openings and a surface of the conductive layer which is not overlapped with the plurality of penetrating openings are formed in one side.

In addition, according to the present invention, a shape of the penetrating opening is not limited to a columnar shape having the same diameter, and a diameter of a cross section taken along a horizontal plane may be partially different. For example, a diameter of an opening in a bottom surface of a insulating film may be ten or more times as long as a diameter of an opening in a top surface of the insulating film, as long as the diameter of the opening in the top surface of the insulating film is longer than a metal particle. In addition, a cross section taken along a horizontal plane of the penetrating opening is not limited to a circle and may also be elliptical or rectangular. When a cross section taken along a horizontal plane of the penetrating opening is elliptical, the length of a minor axis preferably ranges from 3 nm to 2000 nm. When a cross section taken along a horizontal plane of the penetrating opening is rectangular, the length of a narrow side preferably ranges from 3 nm to 2000 nm.

In addition, in order to lower electric resistance, a diameter of an opening in a bottom surface of an insulating film may be the same or may be longer than a diameter of one crystal so that a crystal made of assembled metal particles is formed even in the opening.

Since an opening shape according to the present invention is formed by laser light, the shape can be complicated. According to another feature of the present invention, a semiconductor device comprises a first conductive layer; a plurality of penetrating openings; an insulating film covering the first conductive layer; and a second conductive layer in contact with the first conductive layer through the plurality of penetrating openings, wherein the second conductive layer contains conductive particles, and wherein at least two penetrating openings among the plurality of penetrating openings are connected to each other in the insulating film.

In addition, an opening shape according to the present invention is not limited to a columnar shape extended to a direction of a film thickness (that is, a Z direction). According to the other feature of the present invention, a semiconductor device comprises a first conductive layer; a plurality of penetrating openings; an insulating film covering the first conductive layer; and a second conductive layer in contact with the first conductive layer through the plurality of penetrating openings, wherein the second conductive layer contains conductive particles, and wherein a cross-sectional shape of the plurality of penetrating openings is an L shape, a U shape, or a shape drawing an arc.

In addition, according to the present invention, a penetrating opening refers to a passage leading to upper and lower layers sandwiching an insulating film and a passage extended to a horizontal direction in the insulating film. For example, a cross-sectional shape of the penetrating openings according to the present invention includes an L shape, a U shape, a shape drawing an arc, or the like. Even in the case of the openings having such a complicated cross-sectional shape, the opening having a complicated shape can be filled with a conductive material by adjusting viscosity of the discharging material as long as a droplet discharging method is used.

For example, according to the present invention, a plurality of minute openings can be connected to each other in a plane in contact with a conductive layer. Accordingly, a plurality of minute openings can be provided to a top surface of an insulating film and a contact area can be increased by connecting a plurality of openings with holes in a lateral direction (holes extended to an X direction or a Y direction) provided in vicinity of a bottom surface of the insulating film. In addition, a plurality of vertical holes (holes extended to a Z direction) is connected to horizontal holes (holes extended to an X direction or a Y direction) taken along a bottom surface of the insulating film; therefore, an air escapeway can be provided in discharging droplets and thus air bubbles can be prevented from remaining in the openings.

In addition, according to the above each feature, the semiconductor device includes at least one of an antenna, a CPU (a central processing unit), and a memory. For example, according to the present invention, high integration of an integrated circuit having a multilayer wiring formed through penetrating openings can be realized. Specifically, an integrated circuit having an antenna and a memory for identification and management of goods, merchandise, and people, typically a wireless chip (also referred to as an ID tag, an IC tag, an IC chip, an RF (Radio Frequency) tag, a wireless tag, an electronic tag, or RFID (Radio Frequency Identification)) can be completed.

In addition, according to the above each feature, the semiconductor device is a display device (an LCD panel or an EL panel), a video camera, a digital camera, a personal computer, or a portable information terminal. For example, according to the present invention, an integrated circuit having a multilayer wiring formed through penetrating openings can be manufactured in a simplified process; thus, an electronic device provided with the integrated circuit can be completed.

In addition, according to one feature of a manufacturing method of the present invention to realize the above each feature, a method for manufacturing a semiconductor device comprises the steps of forming a first conductive layer; forming an insulating film over the first conductive layer; forming a plurality of penetrating openings in the insulating film by being selectively irradiated with laser light; and forming a second conductive layer in contact with the first conductive layer through the plurality of penetrating openings by a droplet discharging method or a printing method.

In addition, according to the above feature of the manufacturing method, the step of forming the second conductive layer includes heat treatment in which a surface of the second conductive layer which is overlapped with the plurality of penetrating openings and a surface of the second conductive layer which is not overlapped with the plurality of penetrating openings are formed in one side.

In addition, according to another feature of a manufacturing method of the present invention, a method for manufacturing a semiconductor device comprises the steps of forming a first conductive layer; forming an insulating film over the first conductive layer; forming a plurality of penetrating openings different in depth in the insulating film by being selectively irradiated with laser light; and forming a second conductive layer that fills the plurality of penetrating openings by a droplet discharging method or a printing method.

In addition, according to another feature of a manufacturing method of the present invention, a method for manufacturing a semiconductor device comprises the steps of forming a first conductive layer; forming an insulating film over the first conductive layer; forming a plurality of penetrating openings different in depth in the insulating film by being selectively irradiated with laser light; and forming a second conductive layer by filling the plurality of penetrating openings with conductive particles after discharging a liquid material having the conductive particles into the plurality of penetrating openings by a droplet discharging method.

In addition, according to each feature of the above manufacturing methods, the plurality of penetrating openings is formed by moving a focal position of laser light to an X direction, a Y direction, or a Z direction.

Since the plurality of penetrating openings is formed by moving a focal position of laser light, various openings can be formed. According to each feature of the above manufacturing methods, a cross-sectional shape of the plurality of the penetrating openings is a columnar shape, an L shape, a U shape, or a shape drawing an arc.

In addition, penetrating openings may be formed by forming a closed pore (a pore extended to a Z direction) in a light-transmitting insulating film by laser light in advance to subsequently remove a surface layer by etching or rubbing.

According to another feature of a manufacturing method of the present invention, a method for manufacturing a semiconductor device comprises the steps of forming a first conductive layer; forming an insulating film over the first conductive layer; forming a closed pore in contact with the first conductive layer in the insulating film by being selectively irradiated with laser light; forming the closed pore into a penetrating opening simultaneously with performing thin film process to the insulating film; and forming a second conductive layer in contact with the first conductive layer through the plurality of penetrating openings by a droplet discharging method or a printing method. In other words, a manufacturing method of the present invention, a method for manufacturing a semiconductor device comprises the steps of forming a first conductive layer on a substrate; forming an insulating film on the first conductive layer; forming a plurality of pores in the insulating film by being selectively irradiated with laser light; removing upper regions of the insulating film of the plurality of pores to form a plurality of openings; and forming a second conductive layer in contact with the first conductive layer though the plurality of openings by a droplet discharging method or a printing method.

In addition, according to each feature of the above manufacturing methods, a diameter of the penetrating openings is 3 nm to 2000 nm.

In addition, a method for manufacturing a semiconductor device having a transistor using a semiconductor substrate is also one feature of the present invention. According to the feature, the method for manufacturing a semiconductor device having a transistor comprises the steps of forming a first insulating film over a semiconductor substrate; forming a second insulating film over the first insulating film; forming a first penetrating opening that reaches the first insulating film and a second penetrating opening that reaches the semiconductor substrate in the second insulating film by being selectively irradiated with laser light; and forming a gate electrode in contact with the first insulating film through the first penetrating opening and an electrode in contact with the semiconductor substrate through the second penetrating opening by a droplet discharging method.

In addition, a method for manufacturing a top gate thin film transistor (TFT) formed over a substrate having an insulating surface is also one feature of the present invention. According to the feature, the method for manufacturing a semiconductor device, having a thin film transistor, comprises the steps of forming a semiconductor layer over a substrate having an insulating surface; forming a first insulating film covering the semiconductor layer in the second insulating film by being selectively irradiated with laser light; forming a second insulating film; forming a first penetrating opening that reaches the first insulating film and a second penetrating opening that reaches the semiconductor layer; and forming a gate electrode in contact with the first insulating film through the first penetrating opening and an electrode in contact with the semiconductor layer through the second penetrating opening by a droplet discharging method.

Note that the first insulating film is a gate insulating film. In addition, the second insulating film is an interlayer insulating film.

In addition, a method for manufacturing a bottom gate thin film transistor (TFT) formed over a substrate having an insulating surface is also one feature of the present invention. According to the feature, the method for manufacturing a semiconductor device, having a thin film transistor, comprises the steps of forming a first insulating film over a substrate having an insulating surface; forming a semiconductor layer over the first insulating film; forming a second insulating film above the semiconductor layer; forming a first penetrating opening in the first insulating film and the second insulating film and a second penetrating opening that reaches the semiconductor layer in the second insulating film by being selectively irradiated with laser light; and forming a gate electrode through the first penetrating opening and an electrode in contact with the semiconductor layer through the second penetrating opening by a droplet discharging method, wherein part of the first penetrating opening is formed below the semiconductor layer, and wherein the first insulating film between the first penetrating opening and the semiconductor layer is a gate insulating film. In other words, a method for manufacturing a semiconductor device comprises the steps of forming a first insulating film on a substrate; forming a semiconductor layer on the first insulating film; forming a second insulating film on the semiconductor layer; forming a pore in the first insulating film and an opening that reaches the semiconductor layer in the second insulating film by being selectively irradiated with laser light; and forming a gate electrode through the pore and an electrode in contact with the semiconductor layer through the opening by a droplet discharging method or a printing method.

According to the above feature of the manufacturing method, the first penetrating opening is formed by laser light irradiation from the side of the substrate having an insulating surface or by laser light irradiation from the side of the second insulating film.

In addition, according to the above feature of the manufacturing method, the second insulating film is an interlayer insulating film.

In addition, according to the above feature of the manufacturing method, the first penetrating opening is an opening in which an opening in a Z direction and an opening in an X direction or a Y direction are connected. According to the above manufacturing method of the present invention, the second insulating film is formed first, and then, an opening like a tunnel is formed by laser light and the opening is filled with a conductive material to form a gate electrode. Since the position of the gate electrode in a depth direction can be set arbitrarily with the use of laser light, it is also possible to obtain a thin film of the gate insulating film. Moreover, the gate electrode can also be formed without damaging the gate insulating film.

In addition, according to the above feature of the manufacturing method, a diameter of the first penetrating opening is 3 nm or more and 2000 nm or less.

In addition, according to each feature of the manufacturing method, the laser light oscillates when a pulse width of the laser light is 1 femtosecond or more and 10 picoseconds or less. High intensity multiphoton absorption can occur can be obtained by having the pulse width in the range of 1 femtosecond or more and 10 picoseconds or less. Multiphoton absorption does not occur when a laser beam has a pulse width of several tens picoseconds longer than 10 picoseconds. Moreover, the laser light has a fundamental wave emitted from a laser oscillator the laser repetition frequency of which is 10 MHz or more.

In addition, according to the present invention, a semiconductor film containing silicon as its main component, a semiconductor film containing an organic material as its main component, or a semiconductor film containing metal oxide as its main component can be used for a semiconductor layer. As for the semiconductor film containing silicon as its main component, an amorphous semiconductor film, a semiconductor film including a crystalline structure, a compound semiconductor film including an amorphous structure, or the like, specifically amorphous silicon, microcrystalline silicon, polycrystalline silicon, single crystal silicon, or the like can be used. As for the semiconductor film containing an organic material as its main component, a semiconductor film containing as its main component a material comprising carbon or allotropes (aside from a diamond) of carbon at a quantity, at least having a material which has charge carrier mobility of $10^{-3}$ cm$^2$/V·s or more in room temperature (20° C.), can be used by being combined with other elements. For example, an aromatic of π electron conjugate system, a chain compound, an organic, or an organosilicon compound can be used. Specifically, pentacene, tetracene, thiophen oligomers, phenylenes, a phthalocyanine compound, poly acetylenes, polythiophenes, a cyanine dye, and the like are given as examples. As for the semiconductor film containing metal oxide as its main component, zinc oxide (ZnO); oxide of zinc, gallium, and indium (In—Ga—Zn—O); or the like can be used.

In addition, a semiconductor device according to the present invention may be provided with a protective circuit (for example, a protection diode) for preventing electrostatic discharge damage.

In addition, regardless of a TFT structure and a transistor structure, the present invention can be applied and, for example, a top gate TFT, a bottom gate (reverse stagger) TFT, or a forward stagger TFT can be used. Moreover, not limiting to a transistor having a single gate structure, a multi-gate transistor having a plurality of channel-forming regions, for example, a double gate transistor may be used.

According to the present invention, steps needed to process a wiring in forming a multilayer wiring can be simplified. Further, high integration of a circuit can also be realized.

In addition, a plurality of contact holes different in depth can be realized in a simplified process.

In addition, since a fundamental wave the wavelength of which is approximately 1 μm is used according to the present invention, a contact hole can be formed without damaging an element and a substrate because the fundamental wave is not absorbed by the element and substrate. Therefore, a semiconductor device can be manufactured by using an element that is easily affected by heat or an etching solution or a film substrate that is easily affected by heat or an etching solution.

These and other objects, features and advantages of the present invention will become more apparent upon reading of the following detailed description along with the accompanied drawings.

DETAILED DESCRIPTION OF THE INVENTION

Figure 1A:
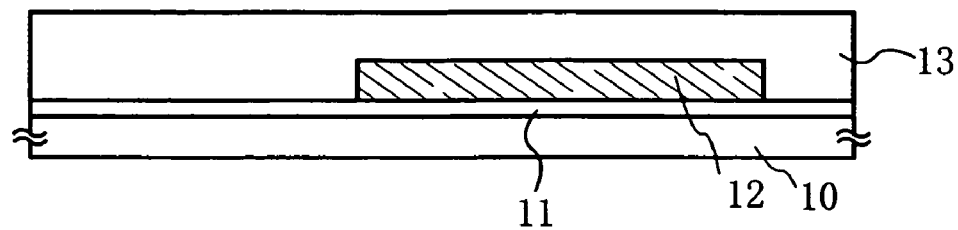
FIGS. 1A to 1D are process cross-sectional views and a top view according to the present invention (Embodiment Mode 1)

Embodiment Mode of the present invention will be described below with reference to the accompanying drawings. However, it is to be easily understood that various changes and modifications will be apparent to those skilled in the art. Therefore, unless such changes and modifications depart from the invention, they should be construed as being included therein. Note that reference numerals denoting the identical portions are the same in all figures.

Embodiment Mode 1

In this embodiment mode, a method for forming a contact hole in a first conductive layer and a method for forming a second conductive layer electrically connected to the first conductive layer through the contact hole will be explained with reference to FIGS. 1A to 1D, FIGS. 2A and 2B, FIG. 10, and FIG. 11.

First, a base insulating film 11 is formed over a substrate 10 having an insulating surface, and a first conductive layer 12 is formed over the base insulating film 11. Next, an insulating film 13 covering the first conductive layer 12 is formed. A cross-sectional view of this stage is shown in FIG. 1A.

Note that a glass substrate or quartz substrate having light transparency is preferably used as the substrate 10 having an insulating surface.

In addition, as for the base insulating film 11, a base film made of an insulating film such as a silicon oxide film, a silicon nitride film, or a silicon oxynitride film is formed. Herein, an example where a two-layer structure is used as a base film is shown; however, the insulating film may be a single layer film or may have a structure where two or more layers are stacked. Note that the base insulating film is not particularly necessary.

In addition, as for the first conductive layer 12, a conductive film 100 nm to 600 nm in thickness is formed by a sputtering method and then patterning is performed with the use of a photolithography technique. Note that the conductive film is formed of one or more elements of Ta, W, Ti, Mo, Al, Cu, and Si, or a single layer or a stacked layer of an alloy material or a compound material containing the element as its main component. Herein, an example where the first conductive layer is formed with the use of a photolithography technique is shown; however, the first conductive layer 12 may be formed by droplet discharging method, a printing method, or electroless plating without being particularly limited. It is preferable for the first conductive layer 12 to use a material that reflects and hardly absorbs laser light used in the subsequent opening process.

Moreover, the first conductive layer 12 may also be formed using a transparent conductive material such as IFO, IZO, or ITSO. It is preferable to use a material that transmits and hardly absorbs laser light used in the subsequent opening process.

In addition, the insulating film 13 is formed using an insulating material that transmits and hardly absorbs laser light used in the subsequent opening process, for example, an insulating film such as a silicon oxide film, a silicon nitride film, or a silicon oxynitride film. Moreover, the insulating film 13 may be formed using an insulating film where a framework structure is formed by the bond between silicon (Si) and oxygen (O), which is obtained by a coating method. Further, as for the insulating film 13, the following can also be used: PSG (phosphosilicate glass) in which phosphorus is added to silicon dioxide; BPSG (borophosphosilicate glass) in which phosphorus and boron are added to silicon dioxide; SiOF in which fluorine is added to silicon dioxide; polyimide; aromatic ether typified by polyfluoroether in which polyallylether or fluorine is added; aromatic hydrocarbon; a cyclobutane derivative typified by BCB (Benzocyclobutene); or the like.

Although a planar insulating film is shown as the insulating film 13 in FIG. 1A, an inorganic insulating film obtained by a CVD method or a sputtering method may be used without being particularly limited. A plurality of openings can be formed using laser light according to the present invention even when the insulating film 13 does not have planarity.

In this embodiment mode, the insulating film 13 is formed by performing drying and baking after coating or discharging the material with the use of a coating method or a droplet discharging method.

Figure 1B:
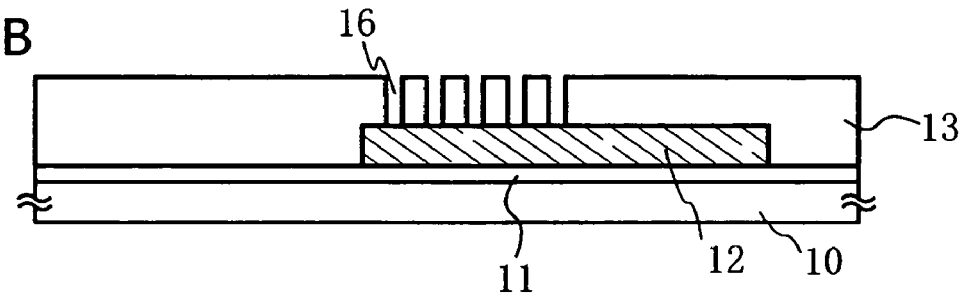

Next, the insulating film 13 is irradiated with laser light to form a plurality of penetrating openings as shown in FIG. 1B. Herein, laser light emitted from an ultrashort pulsed laser is used as the laser light. When an ultrashort pulsed laser is condensed in a light-transmitting material, multiphoton absorption can occur only at a condensed spot where the ultrashort pulsed laser is condensed, a closed pore can be formed, and one penetrating opening can be formed by moving the condensed spot. When the pulsed width of the laser light is $10^{-4}$ seconds to $10^{-2}$ seconds, the laser light is not absorbed by the insulating film 13. However, when multiphoton absorption occurs by irradiating the insulating film 13 with laser light the pulse width of which is extremely short (picoseconds ($10^{-12}$ seconds) or femtoseconds ($10^{-16}$ seconds)), the laser light can be absorbed by the insulating film 13.

Figure 2A:
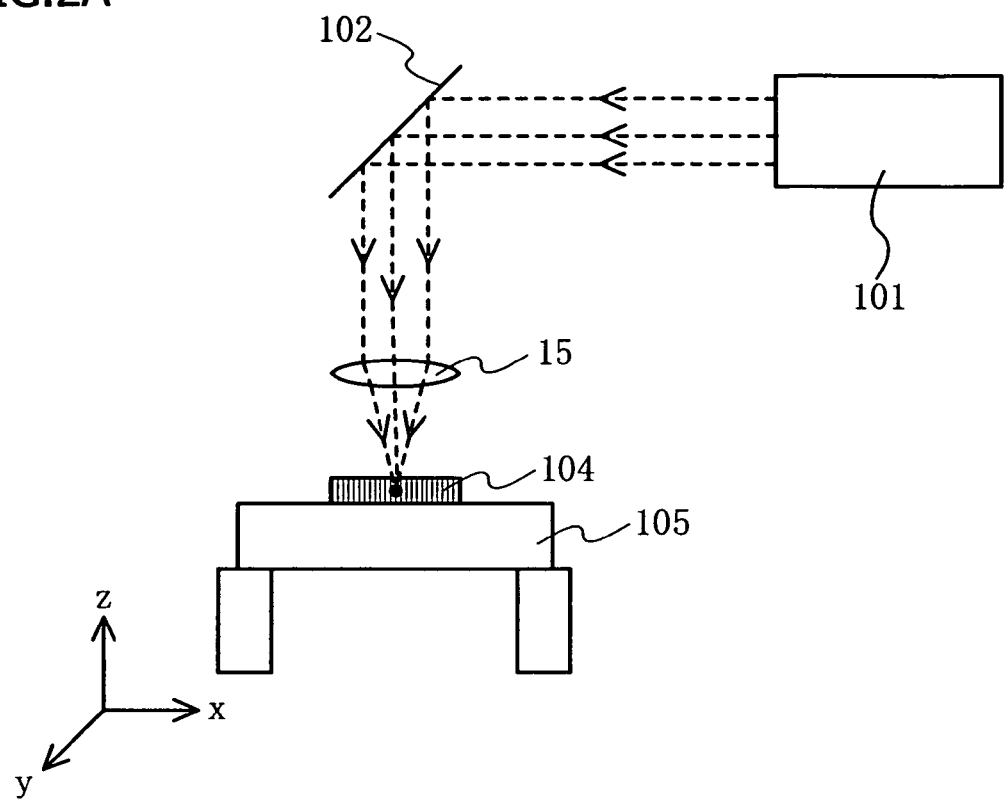
FIGS. 2A and 2B are cross-sectional views explaining a manufacturing process of an opening according to the present invention (Embodiment Mode 1)
Figure 2B:
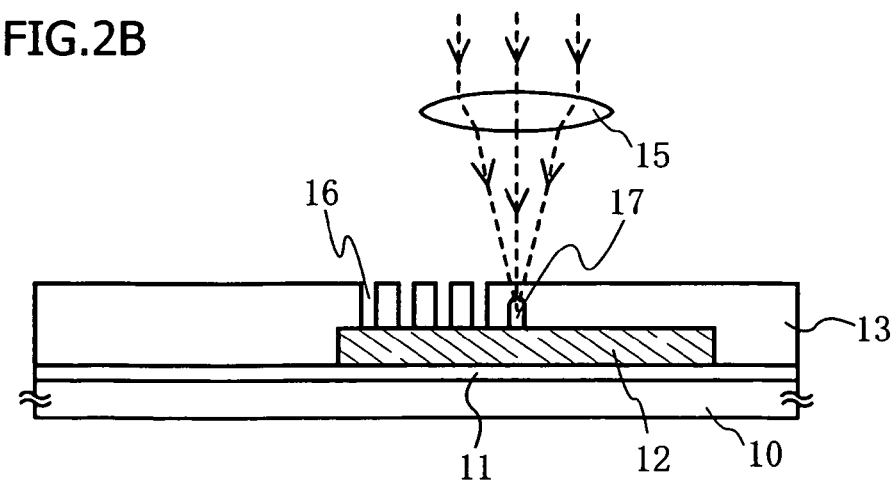

An ultrashort pulsed laser oscillator 101 is a laser oscillator with a pulse width of femtoseconds ($10^{-15}$ seconds). The ultrashort pulsed laser oscillator 101 may be a laser having a medium of a crystal of sapphire, YAG, ceramic YAG, ceramic $Y_2O_3$, KGW (potassium gadolinium tungsten), $Mg_2SiO_4$, YLF, $YVO_4$, $GdVO_4$, or the like, each of which is doped with one or a plurality of Nd, Yb, Cr, Ti, Ho, and Er. Laser light emitted from the ultrashort pulsed laser oscillator 101 is reflected by a mirror 102, and then condensed in a sample 104, herein the insulating film 13 provided over the substrate, by an objective lens 15 with a high numerical aperture (see FIG. 2A). As a result, a pore can be formed in the vicinity of a condensed spot in the insulating film. A desired opening is formed in the insulating film 13 by moving the condensed spot with the use of an XYZ stage 105. FIG. 2B shows a cross-sectional view in the middle of forming an opening. A non-penetrating opening is shown in FIG. 2B as a pore 17.

Note that an ultrashort pulsed laser in this specification is a laser beam oscillated from a solid-state laser where a pulse width is 1 femtosecond or more and 10 picoseconds or less. Note that a peak power of laser light according to the present invention ranges from 1 $GW/cm^2$ to 1 $TW/cm^2$.

The ultrashort pulsed laser allows processing to be performed only at the beam center with high energy density; therefore, fine processing, that is, a laser wavelength or less can be processed using the ultrashort pulsed laser having a laser wavelength or less that is not easily processed by a normal laser.

The insulating film 13 needs to be formed using a material that transmits light having the wavelength of the ultrashort pulsed laser, namely, a material in which light having the wavelength of the ultrashort pulsed laser is not absorbed, and more specifically, a material having a higher energy gap than the ultrashort pulsed laser. When the ultrashort pulsed laser is condensed in the material that transmits light, multiphoton absorption can occur only at a condensed spot where the ultrashort pulsed laser is condensed and a pore can be formed. Note that the multiphoton absorption is a process where two or more photons are absorbed concurrently to make a transition to an eigenstate that corresponds to the sum of energy of the photons. This transition allows light in a wavelength range that is not absorbed to be absorbed; therefore, a pore can be formed in a condensed spot having a sufficiently high light energy density. Note that the term "concurrently" herein referred means that two phenomena occur within $10^{-14}$ seconds.

Figure 10:
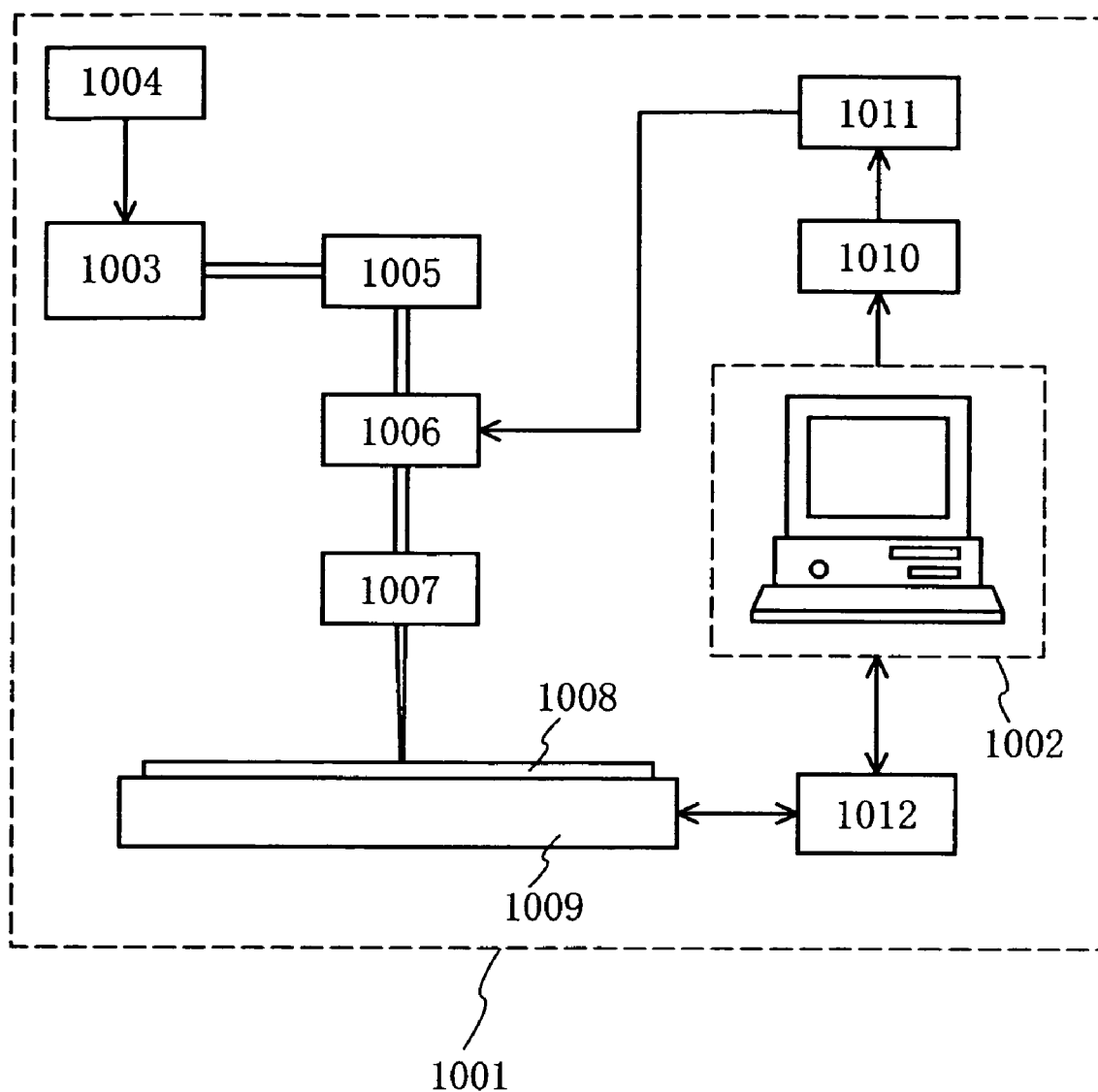
FIG. 10 is a diagram explaining a laser beam direct writing system applicable to the present invention (Embodiment Mode 1)

A laser beam direct writing system is described with reference to FIG. 10. As shown in FIG. 10, a laser beam direct writing system 1001 has a personal computer (hereinafter referred to as a PC) 1002 for carrying out various controls in irradiation of a laser beam; a laser oscillator 1003 for outputting a laser beam; a power supply 1004 of the laser oscillator 1003; an optical system (ND filter) 1005 for attenuating a laser beam; an acousto-optic modulator (AOM) 1006 for modulating the intensity of a laser beam; an optical system 1007 constituted by a lens for magnifying or reducing the cross-sectional surface of a laser beam, a mirror for changing the optical path, and the like; a substrate moving mechanism 1009 having an X stage and a Y stage; a D/A converter portion 1010 for digital-analog converting the control data outputted from the PC; a driver 1011 for controlling the acousto-optic modulator 1006 in accordance with an analog voltage outputted from the D/A converter portion; and a driver 1012 for outputting a driving signal for driving the substrate moving mechanism 1009.

The laser oscillator 1003 is a laser oscillator with a pulse width of femtoseconds ($10^{-15}$ seconds).

Next, a method for irradiating a laser beam using the laser beam direct writing system will be explained. When a substrate 1008 is placed on the substrate moving mechanism 1009, the PC 1002 detects the position of a marker formed on the substrate by using a camera (not shown). Then, the PC 1002 generates movement data for moving the substrate moving mechanism 1009 in accordance with the detected positional data of the marker and the preprogrammed writing pattern data. Subsequently, the PC 1002 controls the amount of light outputted from the acousto-optic modulator 1006 through the driver 1011; therefore, and a laser beam outputted from the laser oscillator 1003 is attenuated by the optical system 1005 and then controlled in quantity by the acousto-optic modulator 1006 to have a predetermined quantity of light.

Meanwhile, the optical path and beam shape of the laser beam outputted from the acousto-optic modulator 1006 is changed by the optical system 1007 and the laser beam is condensed by the lens. Then, an insulating film over the substrate is irradiated with the laser beam to form a pore. At this time, the substrate moving mechanism 1009 is controlled to move in the Z direction in accordance with the movement data generated by the PC 1002. As a result, a predetermined area is irradiated with the laser beam, and the pore is connected to the Z direction to form an opening in the insulating film. When the substrate moving mechanism 1009 is controlled to move in the X direction and the Y direction, a pore is formed in the insulating film in a direction horizontal to the substrate plane.

A laser beam with a shorter wavelength can be condensed to have a shorter diameter of beam. Accordingly, an opening with small diameter can be formed by irradiation of a laser beam with a short wavelength.

The laser beam spot on the surface of the pattern can be processed by the optical system so as to have a dotted shape, a circular shape, an elliptical shape, a rectangular shape, or a linear shape (to be exact, elongated rectangular shape).

Although, herein, the substrate is selectively irradiated with the laser beam while being moved, the present invention is not limited to this and the substrate can be irradiated with the laser beam while scanning the laser beam in the Z direction, X direction, and Y direction. In this case, a polygon mirror, a galvanometer mirror, or an acousto-optic deflector (AOD) is preferably used for the optical system 1007.

Figure 1C:
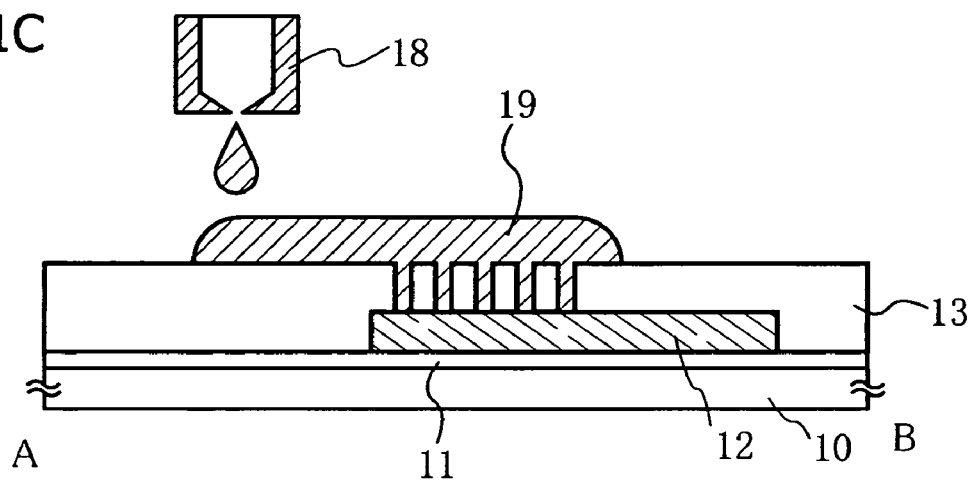

Subsequently, a second conductive layer 19 is formed by discharging a composition containing conductive particles by a droplet discharging method so that a plurality of penetrating openings 16 is overlapped (see FIG. 1C). The second conductive layer 19 is formed using a droplet discharging means 18. The droplet discharging means 18 is a collective term of means for discharging a droplet, such as a nozzle having an outlet of a composition, and a head having one or more nozzles. The droplet discharging means 18 has a nozzle with a diameter of 0.02 μm to 100 μm (preferably, 30 μm or less), and the discharge amount of a composition discharged from the nozzle is 0.001 pl to 100 pl (preferably, 10 pl or less). The discharge amount increases in proportion to the diameter of the nozzle. The distance between an object and the outlet of the nozzle is preferably as short as possible, and reduced to approximately 0.1 mm to 3 mm (preferably, 1 mm or less) in order to discharge the composition onto a desired area.

As for the composition discharged from the outlet, a solution where conductive particles are dissolved or dispersed in a solvent is used. The conductive particles may be a metal such as Ag, Au, Cu, Ni, Pt, Pd, Ir, Rh, W, and Al; a metal sulfide such as Cd and Zn; an oxide such as Fe, Ti, Si, Ge, Zr, and Ba; fine particles such as silver halide particles; or dispersed nanoparticles. However, the composition discharged from the outlet is preferably a solution where gold, silver, or copper is dissolved or dispersed in a solvent in view of the resistivity. More preferably, silver or copper that has low resistance is used. Note that if silver or copper is used, a barrier film is preferably provided for preventing impurities from entering. As for the solvent, esters such as butyl acetate and ethyl acetate, alcohols such as isopropyl alcohol and ethyl alcohol, or an organic solvent such as methyl ethyl ketone and acetone may be used. The viscosity of the composition is preferably 50 cp or less for preventing drying and for allowing the composition to be discharged smoothly from the outlet. The surface tension of the composition is preferably 40 mN/m or less. However, the viscosity and the like of the composition may be set appropriately in accordance with the solvent or the application.

It is preferable that the diameter of the conductive particles is as small as possible in order to prevent each nozzle from clogging or to make fine patterns, and more preferably, each particle has a diameter of 0.1 μm or less, though it depends on the diameter of each nozzle or the desired pattern shape. The composition is formed by a known method such as an electrolytic method, an atomization method, and wet reduction, and the particle size is generally approximately 0.01 μm to 10 μm. Note that if the composition is formed by a gas evaporation method, nanoparticles protected with a dispersant are as fine as approximately 7 nm, and the nanoparticles are dispersed stably at room temperature and behave similarly to liquid without aggregation in a solvent when each of them is protected with a coating. Therefore, it is preferable to use a coating.

Figure 11:
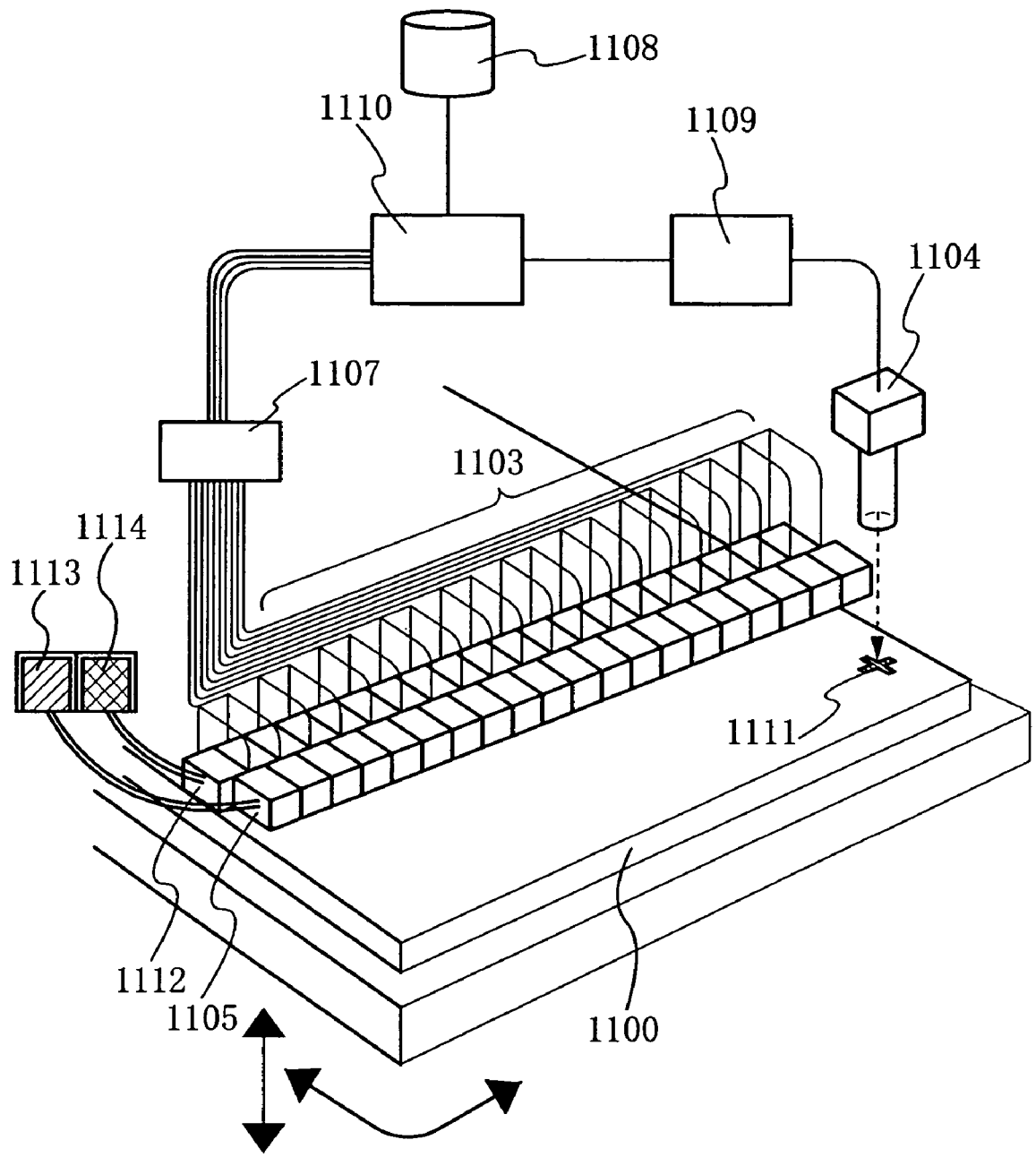
FIG. 11 is a diagram explaining a droplet discharging device applicable to the present invention (Embodiment Mode 1)

Here, a droplet discharging device will be explained with reference to FIG. 11. As the each heads 1105 and 1112 of the droplet discharging means is connected to control means 1107 and the control means 1107 is controlled by a computer 1110, a pattern that has been programmed in advance can be plotted. The timing of plotting may be taken with reference to a marker 1111 formed over a substrate 1100, for example. Alternatively, a reference point may be fixed with an edge of the substrate 1100 as a reference. The reference point is detected by an imaging means 1104 such as an image sensor using a charge coupled device (CCD) or a complementary metal-oxide semiconductor (CMOS), and the computer 1110 recognizes a digital signal converted by an image processing means 1109 to generate a control signal, which is transmitted to a control means 1107. Of course, information of a pattern to be formed over the substrate 1100 is placed in a recording medium 1108. Based on this information, the control signal can be transmitted to the control means 1107 and each head 1105 and 1112 of the droplet discharging means 1103 can be controlled individually. A material to be discharged is supplied to the heads 1105 and 1112 from material supply sources 1113 and 1114 through a piping. Although the longitudinal length of the heads 1105 and 1112 arranged in parallel of the droplet discharging means 1103 corresponds to the width of the substrate in FIG. 11, the droplet discharging device can form a pattern over a large-sized substrate wider than the longitudinal length of the heads 1105 and 1112 by scanning the heads repeatedly. In that case, the heads 1105 and 1112 can be scanned freely over the substrate in directions denoted by arrows so that a region to be written can be freely set. Accordingly, a plurality of same patterns can be written over a substrate.

Next, as well as baking and removing the wiring material by being irradiated with laser light or by heat treatment, any one or a plurality of reaction of fusing, sintering, and welding of conductive particles is performed.

Figure 1D:
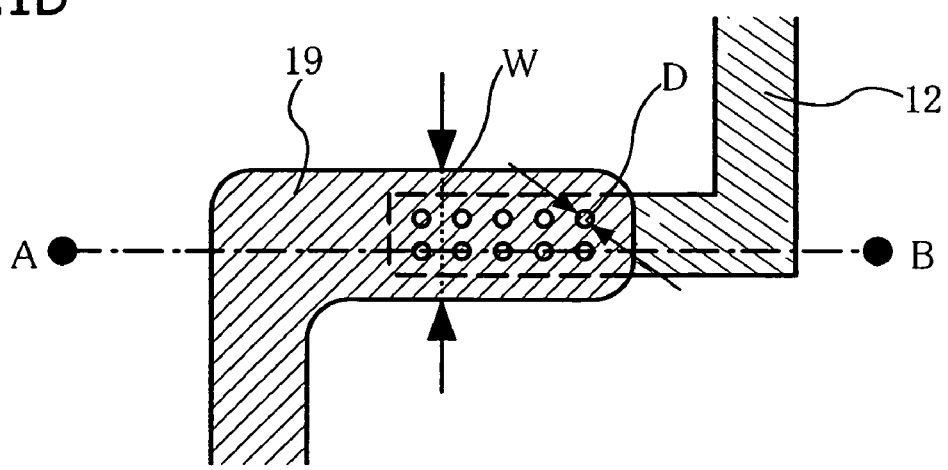

In addition, FIG. 1D shows one example of a top view showing after forming the second conductive layer 19. Note that FIG. 1C corresponds to a cross-sectional view taken along a broken line A-B in FIG. 1D.

As shown in FIG. 1D, a number of penetrating openings (herein, 10 penetrating openings) are provided, and the second conductive layer 19 is electrically connected to the first conductive layer 12 through the openings. Note that the number of the openings is not limited to ten, of course, and disposition of the openings is not particularly limited.

In addition, an insulator between the minute penetrating openings 16 serves as a spacer, which prevents a surface of the second conductive layer from generating a depression. The second conductive layer 19 can have a uniform wiring width. A width of the second conductive layer D and a diameter of each of the plurality of penetrating openings W satisfy 2D<W (FIG. 1D).

Embodiment Mode 2

Figure 3A:
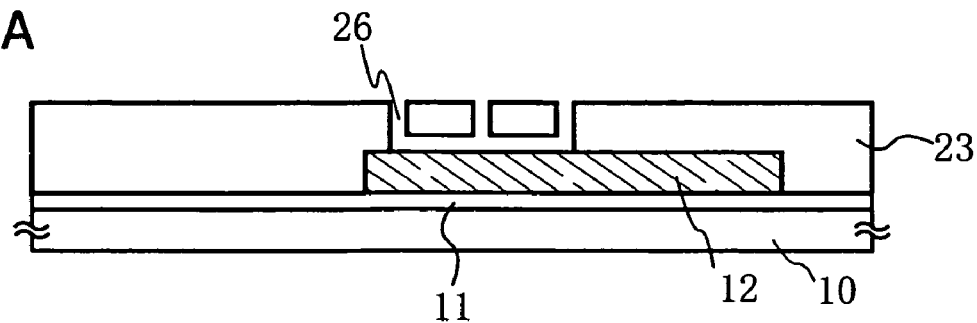
FIGS. 3A to 3C are cross-sectional views and a top view showing one example of an opening shape according to the present invention (Embodiment Mode 2)
Figure 3B:
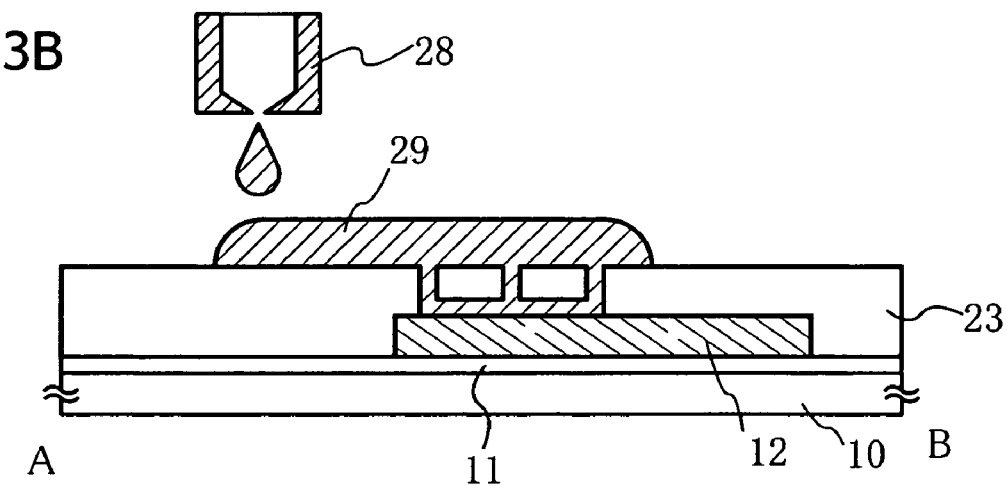
Figure 3C:
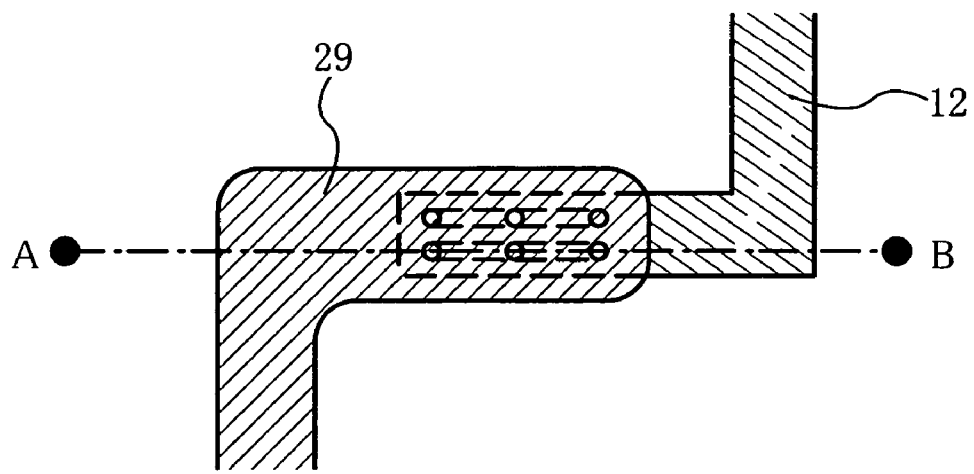

In this embodiment mode, an example of an opening the cross-sectional shape of which differs from Embodiment Mode 1 will be shown with reference to FIGS. 3A to 3C. Portions different from Embodiment Mode 1 will be explained in detail and portions identical with FIGS. 1A to 1D in FIGS. 3A to 3C are denoted by the same reference numerals.

Note that a cross-sectional shape of an opening in FIGS. 1A to 1D is shown in a columnar shape; however, the present invention is not limited thereto and an opening the shape of which has a structure in which a plurality of openings is connected to each other in an insulating film as shown in FIG. 3 may be employed.

First, as well as in Embodiment Mode 1, a base insulating film 11 and a first conductive layer 12 are formed over a substrate 10 having an insulating surface.

Next, after forming an insulating film made of a material that is light transmitting to laser light having a pulse width of $10^{-4}$ seconds to $10^{-2}$ seconds, an insulating film 23 having a penetrating opening 26 is obtained by irradiation of ultrashort pulsed laser light. When an ultrashort pulsed laser is condensed in an insulating film, multiphoton absorption can occur only at a condensed spot where the ultrashort pulsed laser is condensed, a closed pore can be formed, and one penetrating opening can be formed by moving the condensed spot. When the pulsed width of the laser light is $10^{-4}$ seconds to $10^{-2}$ seconds, the laser light is not absorbed by the insulating film 23. However, when multiphoton absorption occurs by irradiating the insulating film 23 with laser light the pulse width of which is extremely short (picoseconds or femtoseconds), the laser light can be absorbed by the insulating film 23.

Note that forming an opening by using laser light is explained in detail in Embodiment Mode 1; therefore, only brief explanation is given here.

The opening 26 having a complicated cross-sectional shape as shown in FIG. 3A can be formed by moving a focal position of laser light to a Z direction, an X direction or a Y direction during laser light irradiation.

Next, a second conductive layer 29 is formed by discharging a composition containing conductive particles so as to overlap with the opening 26 with the use of a droplet discharging method (see FIG. 3B). The second conductive layer 29 is formed by using a droplet discharging means 28.

When a composition is discharged into one opening in the insulating film 23 in forming the second conductive layer 29, air inside the opening is pushed out of the other openings. With such a structure where a plurality of openings is connected in an insulating film, the interior of an opening having a complicated shape can be filled with the conductive particles without leaving a bubble.

Next, baking is performed by heat treatment or laser light irradiation and removal is also performed, and any one or a plural reaction of fusing, sintering, and welding of the conductive particles is performed.

In performing heat treatment, the interior of an opening having a complicated shape may be filled with the conductive particles without leaving a bubble after pushing the bubble to the outside air out of a plurality of openings.

In addition, FIG. 3C shows one example of a top view in a state after forming the second conductive layer 29. Note that FIG. 3B corresponds to a cross-sectional view taken along a broken line A-B in FIG. 3C.

Although the number of openings is six as shown in FIG. 3C, the three openings are each connected in the insulating film, which can be referred to as total two openings having a complicated shape. As compared with Embodiment Mode 1, a few openings are provided on an insulating surface; however, a contact area between the first conductive layer and the second conductive layer is larger in this embodiment mode. Needless to say that the number of openings is not limited to two and disposition of an opening is not limited particularly.

In addition, an insulator between the minute penetrating openings 26 serves as a spacer that holds a surface position of the second conductive layer, which prevents the surface of the second conductive layer from generating a depression. Moreover, a wiring width of the second conductive layer 29 can be made uniform.

In addition, this embodiment mode can be arbitrarily combined with Embodiment Mode 1.

Embodiment Mode 3

In this embodiment mode, an example of forming a plurality of openings with the combination of laser light and etching will be explained with reference to FIGS. 4A to 4C. Portions different from Embodiment Mode 1 will be explained in detail, and portions identical with FIGS. 1A to 1D are denoted by the same reference numerals in FIGS. 4A to 4C.

After forming an insulating film made of a material that is light transmitting to laser light having a pulse width of $10^{-4}$ seconds to $10^{-2}$ seconds, an insulating film 33 having a closed pore 37 is obtained by irradiation of ultrashort pulsed laser light. When an ultrashort pulsed laser is condensed in the insulating film, multiphoton absorption can occur only at a condensed spot where the ultrashort pulsed laser is condensed, a closed pore can be formed, and one penetrating opening can be formed by moving the condensed spot. When the pulsed width of the laser light is $10^{-4}$ seconds to $10^{-2}$ seconds, the laser light is not absorbed by the insulating film 33. However, when multiphoton absorption occurs by irradiating the insulating film 33 with laser light the pulse width of which is extremely short (picoseconds or femtoseconds), the laser light can be absorbed by the insulating film 33.

Note that forming an opening by using laser light is explained in detail in Embodiment Mode 1; therefore, only brief explanation is given here.

Figure 4A:
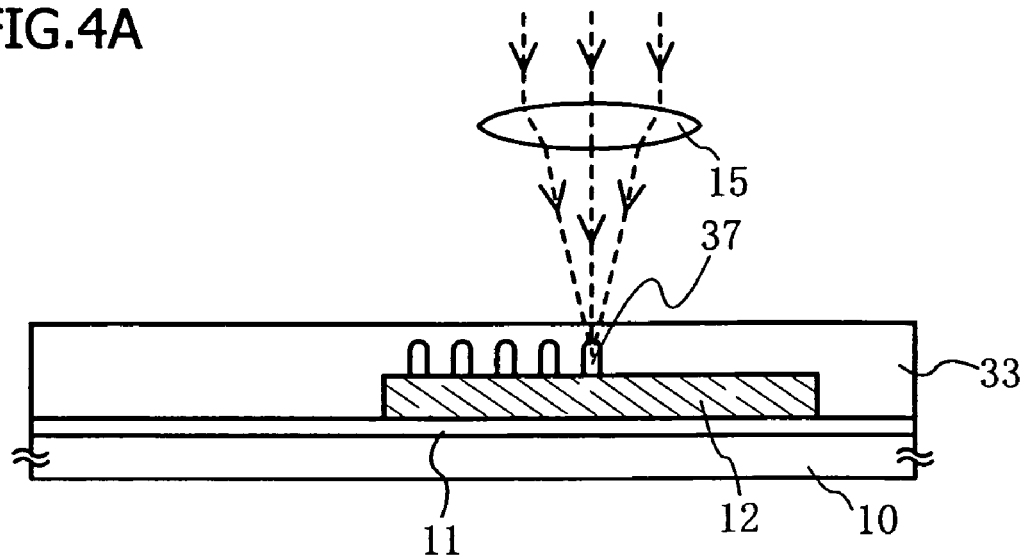
FIGS. 4A to 4C are cross-sectional views explaining a manufacturing process of an opening according to the present invention (Embodiment Mode 3)

As shown in FIG. 4A, a focus of laser light is formed by an optical system 15, which is formed by moving a focal position during laser light irradiation. The closed pore 37 is formed by forming a focus of laser light with the use of an optical system 15 and by moving a focal position during the laser light irradiation.

Figure 4B:
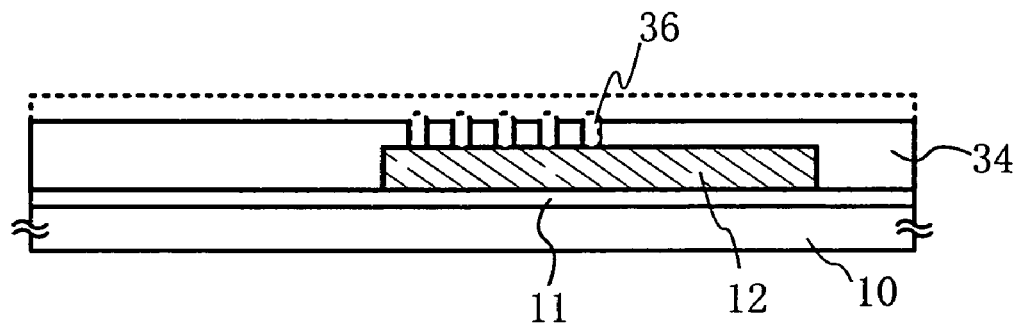

Next, as shown in FIG. 4B, a surface of the insulating film is etched to obtain a thin film. The insulating film above the closed pore 37 is removed by this etching so that an opening 36 penetrating through the closed pore 37 can be formed. An insulating film 34 having a plurality of the penetrating openings 36 is obtained at this stage. Note that a dotted line shown in FIG. 4B shows a surface of the insulating film before etching.

In addition, a thin film of the insulating film may be obtained by polishing (such as CMP) instead of etching.

Figure 4C:
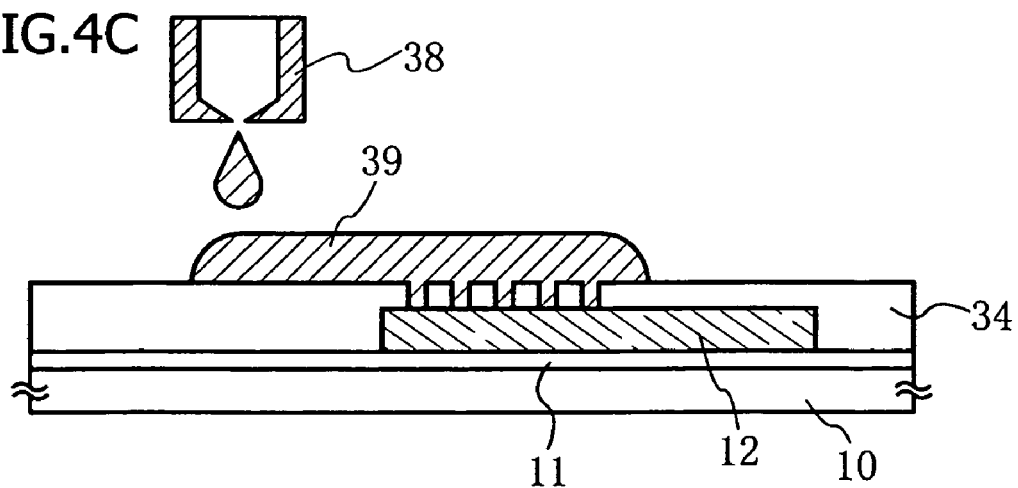

Next, a second conductive layer 39 is formed by discharging a composition containing conductive particles so as to overlap with a plurality of the penetrating openings 36 with the use of a droplet discharging method (see FIG. 4C). The second conductive layer 39 is formed by using a droplet discharging means 38.

Then, baking is performed by heat treatment or laser light irradiation and removal is also performed, and any one or a plural reaction of fusing, sintering, and welding of the conductive particles is performed.

According to this embodiment mode, the penetrating opening having a comparatively shallow depth can be formed in the insulating film.

In addition, this embodiment mode can be arbitrarily combined with Embodiment Mode 1 or Embodiment Mode 2.

Embodiment Mode 4

Figure 5A:
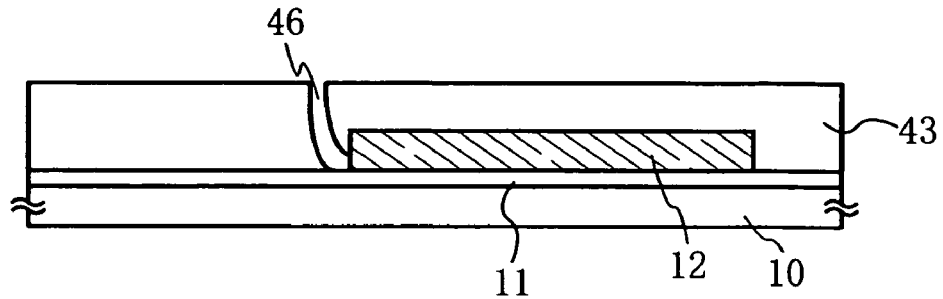
FIGS. 5A to 5C are cross-sectional views and a top view showing one example of an opening shape according to the present invention (Embodiment Mode 4)
Figure 5B:
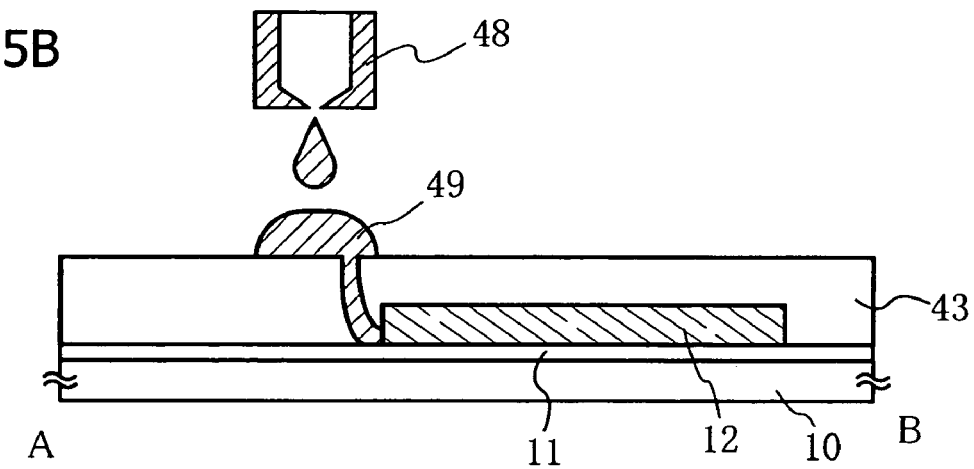
Figure 5C:
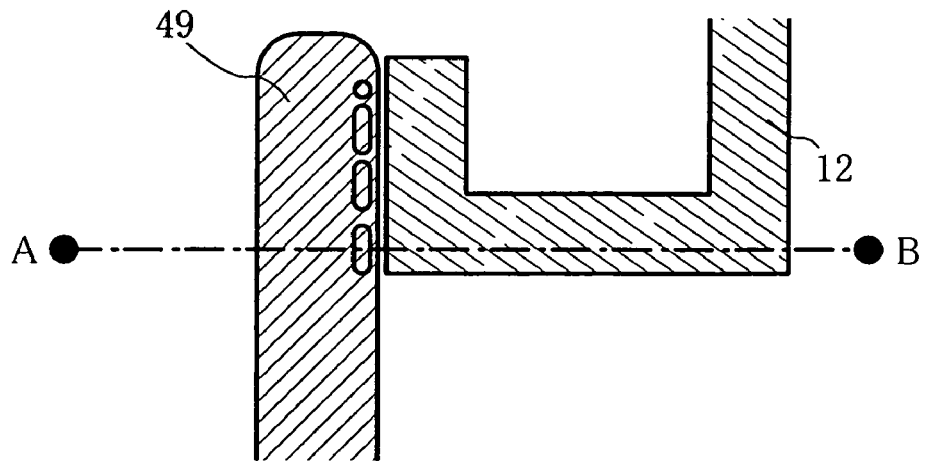

In this embodiment mode, an example different from Embodiment Mode 1 in a cross-sectional shape will be shown in FIGS. 5A to 5C. Portions different from Embodiment Mode 1 will be explained in detail, and portions identical with FIGS. 1A to 1D are denoted by the same reference numerals in FIGS. 5A to 5C.

In this embodiment mode, an example in which a cross-sectional shape of an opening is curved is shown.

First, as well as in Embodiment Mode 1, a base insulating film 11 and a first conductive layer 12 are formed over a substrate 10 having an insulating surface.

Next, after forming an insulating film made of a material that is light transmitting to laser light, an insulating film 43 having a penetrating opening 46 is obtained by irradiation of ultrashort pulsed laser light. When the pulsed width of the laser light is $10^{-4}$ seconds to $10^{-2}$ seconds, the laser light is not absorbed by the insulating film 43. However, when multiphoton absorption occurs by irradiating the insulating film 43 with laser light the pulse width of which is extremely short (picoseconds or femtoseconds), the laser light can be absorbed by the insulating film 43.

Note that forming an opening by using laser light is explained in detail in Embodiment Mode 1; therefore, only brief explanation is given here.

The opening 46 having a curved cross-sectional shape as shown in FIG. 5A can be formed by moving a focal position to an X direction or a Y direction during laser light irradiation and then moving to a Z direction and repeatedly moving again to the X direction or Y direction.

Note that a side of the first conductive layer 12 of the opening 46 having a curved cross-sectional shape is exposed.

Next, a second conductive layer 49 is formed by discharging a composition containing conductive particles so as to overlap with a plurality of the penetrating openings 46 with the use of a droplet discharging method (see FIG. 5B). The second conductive layer 49 is formed by using a droplet discharging means 48. In this embodiment mode, a cross-sectional shape of the opening is curved; therefore, the interior of the opening can be filled smoothly with the composition containing conductive particles.

Then, baking is performed by heat treatment or laser light irradiation and removal is also performed, and any one or a plural reaction of fusing, sintering, and welding of the conductive particles is performed.

In addition, FIG. 5C shows one example of a top view in a state after forming the second conductive layer 49. Note that FIG. 5B corresponds to a cross-sectional view taken along a broken line A-B in FIG. 5C. Moreover, FIG. 5C shows an example in which two kinds of openings in an elliptical shape and a circular shape are formed. In other words, three elliptical openings and one circular opening, that is, total four openings are formed. Thus, according to the present invention, a variety of openings can be formed by adjusting a focal position of laser light arbitrarily.

According to this embodiment mode, a cross-sectional shape of the penetrating opening 46 is curved so that the opening can be conducted electrically with the second conductive layer 49 on the side surface of the first conductive layer 12. Therefore, the first conductive layer 12 and the second conductive layer 49 are disposed so as not to overlap with each other. Parasitic capacitance formed between the first conductive layer 12 and the second conductive layer 49 can be reduced by having such a disposition.

In addition, this embodiment mode can be arbitrarily combined with Embodiment Mode 1, Embodiment Mode 2, or Embodiment Mode 3.

Embodiment Mode 5

In this embodiment mode, an example of forming a TFT with the use of an opening formed by using laser light according to the present invention is shown with reference to FIGS. 6A to 6D.

First, a base insulating film 201 is formed over a substrate 200 having an insulating surface. As for the substrate 200 having an insulating surface, a light-transmitting substrate, for example, a glass substrate, a crystalline glass substrate, or a plastic substrate can be used. As for the plastic substrate, a plastic film substrate, for example, a plastic substrate of poly (ethylene terephthalate) (PET), poly(ether sulfone) (PES), poly(ethylene naphthalate) (PEN), polycarbonate (PC), nylon, polytheretherketone (PEEK), polysulfone (PSF), poly (ether imide) (PEI), polyarylate (PAR), poly(butylene terephthalate) (PBT), or the like is preferable. In addition, a plastic substrate having heat resistance, for example, a plastic substrate in which a material where inorganic particles of several nm diameters are dispersed in an organic polymer matrix is processed in a sheet may also be used.

As for the base insulating film 201, an insulating film such as a silicon oxide film, a silicon nitride film, or a silicon oxynitride ($SiO_xN_y$) film is used. As a typical example of the base insulating film 11, a two-layer structure in which a silicon nitride oxide film 50 nm to 100 nm in thickness, deposited with the use of $SiH_4$, $NH_3$, and $N_2O$ as a reactive gas, and silicon oxynitride film 100 nm to 150 nm in thickness, deposited with the use of $SiH_4$ and $N_2O$ as a reactive gas, are stacked is employed. In addition, a silicon nitride film (SiN film) or a silicon oxynitride film ($SiN_xO_y$ film (X>Y)) the film thickness of which is 10 nm or less is preferably used as one layer of the base insulating film 201. Moreover, a three-layer structure in which a silicon nitride oxide film, a silicon oxynitride film, and a silicon nitride film are sequentially stacked may also be employed. An example of forming the base insulating film 201 is shown here; however, the base insulating film 201 is not necessarily provided if not necessary.

Next, a first insulating film 202 serving as a gate insulating film is formed. As for the first insulating film 202, it is preferable to use a material that transmits and hardly absorbs a fundamental wave of laser light used in the following opening process. As for the first insulating film 202, an insulating film such as a silicon oxide film, a silicon nitride film, or a silicon oxynitride film is used. In addition, as for the first insulating film 202, a film that is obtained by coating and baking a solution containing polysilazane or a siloxane polymer, a photo-curing organic resin film, a thermosetting organic resin film, or the like may also be used.

Then, a semiconductor film is formed. The semiconductor film is formed with an amorphous semiconductor film or a microcrystalline semiconductor film that is manufactured by a vapor-phase growth method, a sputtering method, or a thermal CVD method with the use of a semiconductor material gas typified by silane and germanium. In this embodiment mode, an example of using an amorphous silicon film as the semiconductor film is shown. In addition, as for the semiconductor film, ZnO or oxide of zinc gallium indium manufactured by a sputtering method or a PLD (Pulsed Laser Deposition) method may also be used; however, in that case, the gate insulating film is preferably an oxide containing aluminum or titanium. Moreover, as for the semiconductor film, an organic material such as pentacene, tetracene, thiophen oligomers, phenylenes, a phthalocyanine compound, poly acetylenes, polythiophenes, or a cyanine dye, manufactured by a coating method, a droplet discharging method, or a vapor deposition method, may also be used.

Subsequently, a conductive semiconductor film is formed. As for the conductive semiconductor film, a semiconductor film exhibiting n-type or p-type conductivity in which n-type or p-type impurities are added is used. The n-type semiconductor film may be formed by a PCVD method with the use of a silane gas and a phosphine gas. In this embodiment mode, an example of using a silicon film containing phosphorus is shown as the conductive semiconductor film. Note that, in the case of using an organic material such as pentacene as the semiconductor film, a charge-transporting layer is preferably used instead of the conductive semiconductor film and, for example, triphenyldiamine serving as a hole-transporting layer or oxadiazole serving as an electron-transporting layer is preferably used.

Next, an island-shape semiconductor layer 207 and a conductive semiconductor layer 206 are obtained by patterning with the use of a known photolithography technique. Note that a mask may be formed using a droplet discharging method or a printing method (relief printing, lithography, copperplate printing, screen printing, or the like) to perform etching selectively, instead of the known photolithography technique.

Figure 6A:
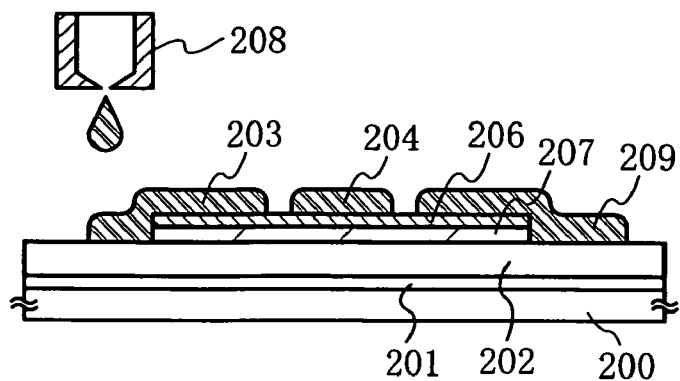
FIGS. 6A to 6D are cross-sectional views showing a manufacturing process of a bottom gate TFT (Embodiment Mode 5)

Then, wirings 203, 204, and 209 are formed by selectively discharging a composition containing a conductive material (Ag (silver), Au (gold), Cu (copper), W (tungsten), Al (aluminum), or the like) by a droplet discharging method. FIG. 6A shows a state in which the composition containing a conductive material is discharged from an ink-jet head 208. Note that the wirings 203, 204, and 209 are not limited to be formed by a droplet discharging method and, for example, the wirings may be formed by forming a metal film with the use of a sputtering method, forming a mask, and performing etching selectively.

Subsequently, the conductive semiconductor layer and an upper portion of the semiconductor layer are etched with the use of the wirings 203, 204, and 209 as each a mask to expose part of the semiconductor layer. The exposed portion of the semiconductor layer is a portion serving as a channel-forming region of a TFT.

Next, an interlayer insulating film 211 including a protective film is formed to prevent the channel-forming region from being contaminated with impurities. As for the protective film, silicon nitride obtained by a sputtering method or a PCVD method or a material containing silicon nitride oxide as its main component is used. Hydrogenation treatment is performed in this embodiment mode after forming the protective film. In addition, as for the interlayer insulating film, a resin material such as epoxy resin, acrylic resin, phenol resin, novolac resin, melamine resin, or urethane resin is used. Moreover, an organic material such as benzocyclobutene, parylene, fluorinated-arylene-ether, or polyimide having transmissivity; a compound material made by polymerization of a siloxane-based polymer or the like; a composition material containing a water-soluble homopolymer and a water-soluble copolymer; or the like can be used.

Figure 6B:
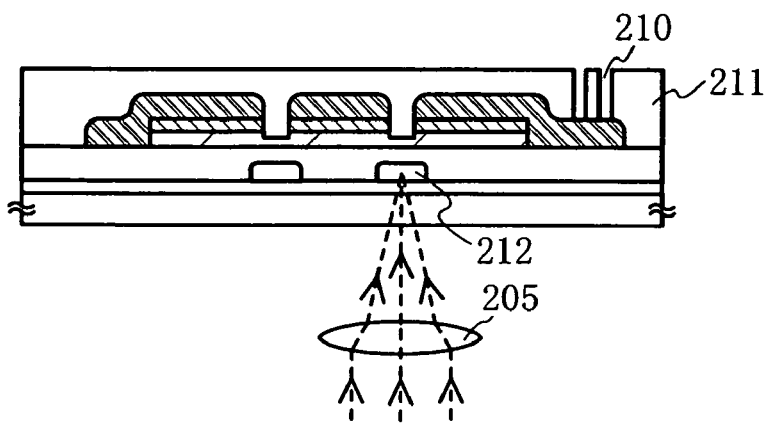

Then, a plurality of first openings 210 is formed by irradiating the interlayer insulating film 211 including the protective film with ultrashort pulsed laser light. In addition, in order to prevent the channel-forming region from being irradiated with laser light, a plurality of second openings 212 is also formed by irradiating the backside of the substrate as well with ultrashort pulsed laser light. FIG. 6B shows a cross-sectional view in which the second openings 212 are formed by ultrashort pulsed laser light that passes through an optical system 205.

When the pulsed width of the laser light is $10^{-4}$ seconds to $10^{-2}$ seconds, the laser light is not absorbed by the interlayer insulating film 211 including the protective film. However, when multiphoton absorption occurs by irradiating the interlayer insulating film 211 including the protective film with laser light the pulse width of which is extremely short (picoseconds or femtoseconds), the laser light can be absorbed by the interlayer insulating film 211 including the protective film.

Note that forming an opening by using laser light is explained in detail in Embodiment Mode 1; therefore, only brief explanation is given here.

In this embodiment mode, the first insulating film 202 between the second opening 212 and the semiconductor layer 207 serves as a gate insulating film. Therefore, the film thickness of the gate insulating film can be determined arbitrarily by the formation of the second opening 212.

Subsequently, a composition containing conductive particles is discharged with the use of a droplet discharging method to fill each opening with the conductive particles so as to overlap with a plurality of the penetrating first openings and second openings. Then, the conductive particles are fused and aggregated to have a crystal of approximately 100 nm when baking is performed; thus, a gate electrode, gate wirings 214 and 215, and a connection wiring 213 are formed (see FIG. 6C). In this embodiment mode, the gate electrode and gate wirings disposed in different layers can be formed simultaneously and with the same material.

A channel etch TFT is completed at this stage. A significant feature of this embodiment mode is the process order in which the gate electrode is formed after forming the interlayer insulating film.

Figure 6C:
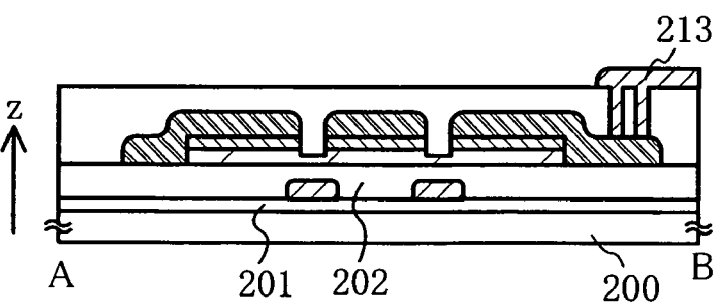
Figure 6D:
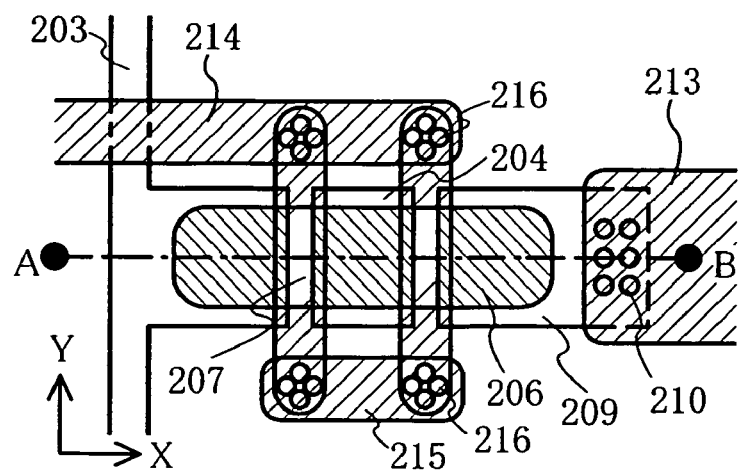

FIG. 6D shows one example of a top view of a TFT at the stage of FIG. 6C. In FIG. 6D, a cross section taken along a broken line A-B corresponds to a cross-sectional view of FIG. 6C. Note that corresponding portions are denoted by the same reference numerals.

FIG. 6D shows a double-gate TFT having two channel-forming regions. The gate wirings 214 and 215 are electrically connected through a third opening 216 formed in a Z direction (a direction perpendicular to the substrate) and the second opening 212 formed in a Y direction. Note that the third opening 216 is formed using laser light in the same manner as the first opening or the second opening.

In addition, the second opening 212 and the third opening 216 are connected in the interlayer insulating film. Moreover, the third opening 216 differs from the first openings 210 in depth. Further, the connection wiring 213 is electrically connected to a wiring 209 through the first openings 210.

In addition, in this embodiment mode, the formation order of the first opening and the second opening is not particularly limited and the second opening may be formed first. Moreover, the third opening may be formed by continuously moving a focal position of laser light in forming the second opening.

In addition, an active matrix liquid crystal display device can be manufactured with the use of the connection wiring 213 as a pixel electrode. Moreover, an active matrix light-emitting display device can also be manufactured by forming a first electrode overlapping the connection wiring 213 and a partition covering a first end and stacking a layer containing an organic compound and a second electrode over the first electrode.

According to this embodiment mode, since a gate electrode is formed subsequently, a semiconductor layer 207 can be formed over a flat insulating surface; thus, an opening for forming the gate electrode can be formed without causing damage to the semiconductor layer. Therefore, the semiconductor layer can be formed by a coating method, which is effective in using an organic material for the semiconductor layer.

In addition, according to this embodiment mode, since the opening is formed by laser light, the comparatively low number of manufacturing processes of a TFT can be realized.

In addition, this embodiment mode can be arbitrarily combined with Embodiment Mode 1, Embodiment Mode 2, Embodiment Mode 3, or Embodiment Mode 4.

Embodiment Mode 6

In this embodiment mode, an example of forming a TFT different from that of Embodiment Mode 5 is shown with reference to FIGS. 7A to 7D.

First, a base insulating film 301 is formed over a substrate 300 having an insulating surface. As for the substrate 300 having an insulating surface, a light-transmitting substrate, for example, a glass substrate, a crystalline glass substrate, or a plastic substrate can be used. When an opening is formed without laser light passing through the substrate in the following process, a semiconductor substrate, a metal substrate, or the like can be used.

As for the base insulating film 301, an insulating film such as a silicon oxide film, a silicon nitride film, or a silicon oxynitride ($SiO_xN_y$) film is used.

Next, a semiconductor layer is formed over the base insulating film 301. The semiconductor layer is formed by depositing a semiconductor film having an amorphous structure by a known means (a sputtering method, an LPCVD method, a plasma CVD method, or the like), then forming a resist film over a crystalline semiconductor film obtained by performing known crystallization treatment (a laser crystallization method, a thermal crystallization method, a thermal crystallization method using a catalyst such as nickel, or the like), and then patterning it into a desired shape with the use of a first resist mask which is exposed by scanning laser light. This semiconductor layer is formed to have a thickness of 25 nm to 80 nm (preferably, 30 nm to 70 nm). A material of the crystalline semiconductor film is not limited; however, silicon or a silicon germanium (SiGe) alloy is preferably used to form the crystalline semiconductor film.

Then, a gate insulating film 303 covering the semiconductor layer is formed after removing the first resist mask. The gate insulating film 303 is formed to have a thickness of 1 nm to 200 nm with the use of a plasma CVD method, a sputtering method, or a thermal oxidation method. As for the gate insulating film 303, a film formed of an insulating film such as a silicon oxide film, a silicon nitride film, or a silicon oxynitride film is formed.

Subsequently, a second resist mask to which light exposure is performed by scanning laser light is formed after forming a resist film over the gate insulating film 303. As for the second resist mask, an impurity element imparting p-type or n-type conductivity is selectively added to the semiconductor layer by using an ion doping method or an ion implantation method. Accordingly, regions where the impurity element is added serve as impurity regions 304, 306, and 307. In addition, a region 302 covered with the second resist mask where the impurity element is not added serves as a channel-forming region of a TFT.

Thereafter, the second resist mask is removed and the impurity element added to the semiconductor layer is activated and hydrogenated.

Figure 7A:
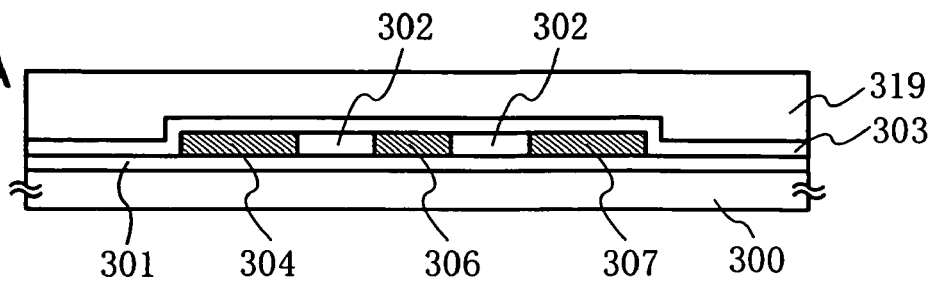
FIGS. 7A to 7D are cross-sectional views showing a manufacturing process of a top gate TFT (Embodiment Mode 6)

Next, as shown in FIG. 7A, an interlayer insulating film 319 having planarity is formed. As for the interlayer insulating film 319, a light-transmitting inorganic material (silicon oxide, silicon nitride, silicon oxynitride, or the like), a photosensitive or non-photosensitive organic material (polyimide, acrylic, polyamide, polyimide amide, resist, or benzocyclobutene), a stack of these materials, or the like is used. Moreover, as for another light-transmitting film used for the interlayer insulating film 319, an insulating film formed of an $SiO_x$ film containing an alkyl group, obtained by a coating method, for example, an insulating film formed using silica glass, an alkyl siloxane polymer, an alkyl silsesquioxane polymer, a hydrogenated silsesquioxane polymer, a hydrogenated alkyl silsesquioxane polymer, or the like can be used. As one example of a siloxane-based polymer, a coating material for an insulating film such as #PSB-K1 and #PSB-K31 manufactured by Toray Industries, Inc., and a coating material for an insulating film such as #ZRS-5PH manufactured by Catalysts & Chemicals Industries Co., Ltd. can be given.

Figure 7B:
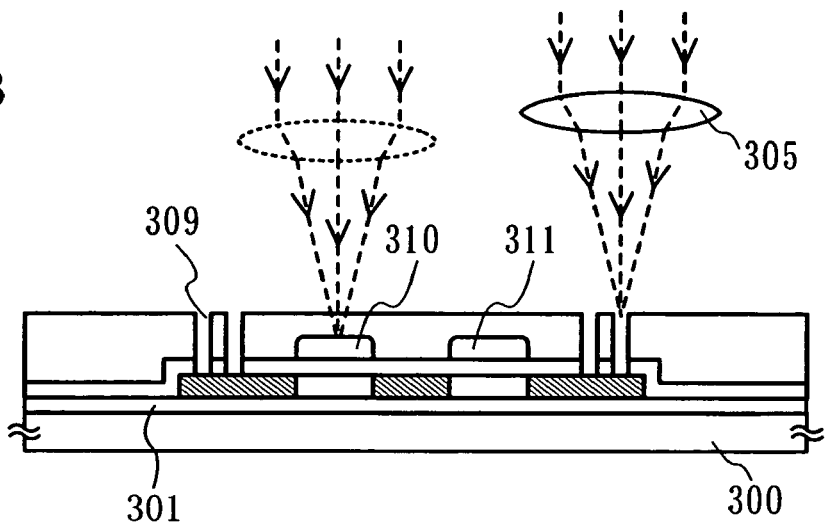

Then, a plurality of first openings 309 are formed in the interlayer insulating film 319 and the gate insulating film 303 with the use of laser light. The plurality of first openings 309 is formed to reach the impurity regions 304 and 307. In addition, a plurality of second openings 310 and 311 is formed in the interlayer insulating film 319 with the use of laser light. The plurality of second openings 310 and 311 is formed so as to overlap with the position of the regions 302 where the impurity element is not added. FIG. 7B shows a cross-sectional view where a focal position of ultrashort pulsed laser light is moved after forming the second opening 310 to form the first opening 309 by the ultrashort pulsed laser light that passes through an optical system 305.

When the pulsed width of the laser light is $10^{-4}$ seconds to $10^{-2}$ seconds, the laser light is not absorbed by the interlayer insulating film 319 including the protective film. However, when multiphoton absorption occurs by irradiating the interlayer insulating film 319 including the protective film with laser light the pulse width of which is extremely short (picoseconds or femtoseconds), the laser light can be absorbed by the interlayer insulating film 319 including the protective film.

Note that forming an opening by using laser light is explained in detail in Embodiment Mode 1; therefore, only brief explanation is given here.

Figure 7C:
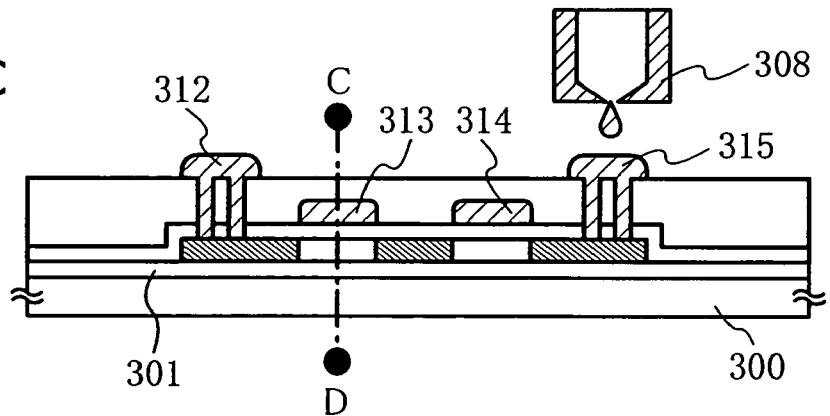

Subsequently, a composition containing conductive particles of 3 nm to 7 nm is discharged with the use of a droplet discharging method to fill each opening with the conductive particles so as to overlap with a plurality of the penetrating first openings and second openings. Then, the conductive particles are fused and aggregated to have a crystal of approximately 100 nm when baking is performed; thus, gate electrodes 313 and 314, and source or drain electrodes 312 and 315 are formed (see FIG. 7C). In this embodiment mode, a gate electrode and a source electrode disposed in different layers can be formed with the same material. FIG. 7C shows a state in which a composition containing a conductive material is discharged from the ink-jet head 308.

A top gate TFT is completed at this stage. FIG. 7C shows a double gate TFT having two channel-forming regions. A significant feature of this embodiment mode is process order in which the gate electrode is formed after forming the interlayer insulating film.

Figure 7D:
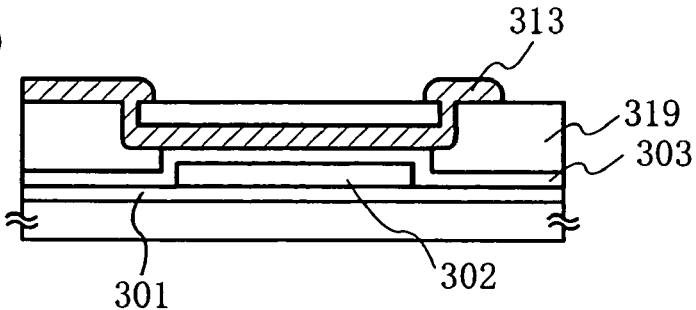

FIG. 7D shows one example of a TFT taken along in a different cross section from FIG. 7C. In FIG. 7C, a cross-sectional view taken along in a cross section including a broken line C-D corresponds to FIG. 7D. Note that corresponding portions are denoted by the same reference numerals.

As shown in FIG. 7D, the second opening 310 is extended inside the interlayer insulating film 319, and the bottom of the second opening 310 is in contact with the gate insulating film 303.

In addition, although not shown here, the gate electrodes 313 and 314 are in one wiring over the interlayer insulating film 319.

In addition, an active matrix liquid crystal display device can be manufactured with the use of the TFT shown in this embodiment mode as a switching element.

Hereinafter, a method for manufacturing a liquid crystal display device with the use of the TFT shown in this embodiment mode as a switching element is shown.

Figure 8:
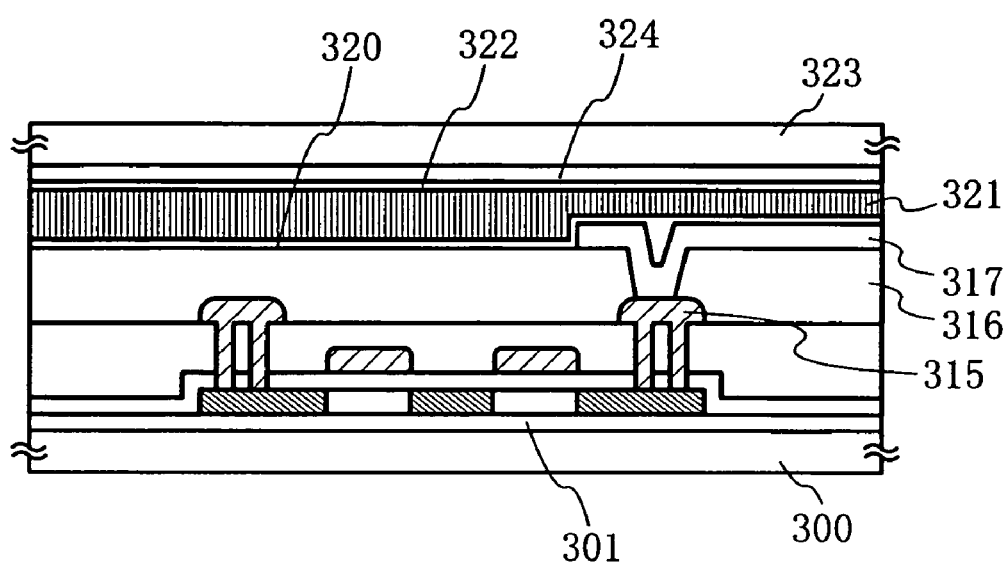
FIG. 8 is a cross-sectional view showing a structure of an active matrix liquid crystal display device (Embodiment Mode 6)

An insulating film 316 is formed after forming the source or drain electrode 315 (FIG. 8). Then, a contact hole is formed in the insulating film 316 to form a pixel electrode 317 with ITO or the like. In addition, a terminal electrode is formed with ITO or the like over the insulating film 316.

Next, an alignment film 320 is formed so as to cover the pixel electrode 317. Note that the alignment film 320 is preferably formed using a droplet discharging method, a screen printing method, or an offset printing method. Thereafter, rubbing treatment is performed to the surface of the alignment film 320.

In addition, an opposite substrate 323 is provided with an opposite electrode 324 formed with a transparent electrode and an alignment film 322 thereover. A sealant (not shown) with a closed pattern is then formed by a droplet discharge method so as to surround a region overlapped with a pixel portion. Here, an example of drawing a sealant with a closed pattern is shown in order to drop a liquid crystal. A dip coating method (pumping up method) by which a liquid crystal is injected by using capillary phenomenon may be used after providing a seal pattern having an opening and attaching the TFT substrate and an opposite substrate.

Then, a liquid crystal is dropped under reduced pressure so as to prevent bubbles from entering, and the both substrates are attached together. A liquid crystal is dropped once or several times in the closed-loop seal pattern. A twisted nematic (TN) mode is mostly used as an alignment mode of a liquid crystal. In this TN mode, the alignment direction of liquid crystal molecules is twisted at 90° according to the polarization of light from its entrance to the exit. In the case of manufacturing a liquid crystal display device of TN mode, the substrates are attached together so that the rubbing directions are crossed each other.

Note that the space between the pair of substrates may be maintained by spraying a spherical spacer, forming a columnar spacer comprising resin, or mixing a filler into the sealant. The above columnar spacer is formed of an organic resin material mainly containing at least one material of acrylic, polyimide, polyimide amide, and epoxy; any one material of silicon oxide, silicon nitride, and silicon oxynitride; or an inorganic material composed of a film stack of these materials.

Subsequently, an unnecessary substrate is divided. In the case of obtaining a plurality of panels from one substrate, each panel is separated off. In the case of obtaining one panel from one substrate, the separation step can be skipped by attaching an opposite substrate which is cut in advance.

Then, an FPC is attached to the terminal electrode with an anisotropic conductive layer therebetween by a known method. A liquid crystal module is completed according to the foregoing processes (FIG. 8). In addition, an optical film such as a color filter is attached, if necessary. In the case of a transmissive liquid crystal display device, polarization plates are respectively attached to both an active matrix substrate and an opposite substrate.

In addition, an active matrix light-emitting device can be manufactured with the use of the TFT shown in this embodiment mode.

Hereinafter, a method for manufacturing an active matrix light-emitting display device with the use of the TFT shown in this embodiment mode is shown. Herein, an example where the TFT is an n-channel TFT is shown.

An insulating film 316 is formed after forming a source or drain electrode 315. Then, a contact hole is formed in the insulating film 316 to form a first electrode 318.

It is preferable that the first electrode 318 serves as a cathode. In the case of passing light through the first electrode 318, the first electrode 318 is formed by forming a predetermined pattern made from a composition containing indium tin oxide (ITO), indium tin oxide containing silicon oxide (ITSO), zinc oxide (ZnO), tin oxide ($SnO_2$), or the like. In addition, in the case of reflecting light by the first electrode 318, the first electrode 318 is formed by forming a predetermined pattern made from a composition containing metal particles as its main component such as Ag (silver), Au (gold), Cu (copper), W (tungsten), or Al (aluminum).

Next, a partition 331 for covering the periphery of the first electrode 318 is formed. The partition 331 (also referred to as a bank) is formed using a material containing silicon, an organic material, and a compound material. Further, a porous film can also be used for the partition 331. The partition 331 is preferably formed by a photosensitive or a non-photosensitive material such as acrylic or polyimide, because the partition 331 is formed to have a curved edge portion having a radius of curvature varying continuously, and an upper thin film of the partition 331 can be formed without step cut.

Then, a layer serving as an electroluminescent layer, that is, a layer containing an organic compound 330 is formed. The layer containing an organic compound 330 has a layered structure in which each layer is formed by a vapor deposition method or a coating method. For example, an electron-transporting layer (electron-injecting layer), a light-emitting layer, a hole-transporting layer, and a hole-injecting layer are sequentially stacked over a cathode.

Before forming the layer containing an organic compound 330, plasma treatment in the presence of oxygen or heat treatment in vacuum atmosphere is preferably performed. In the case of using a vapor deposition method, an organic compound is vaporized by resistance heating in advance, and scattered toward a substrate by opening a shutter in depositing the organic compound. The vaporized organic compound is scattered upward and deposited over a substrate through an opening portion provided to a metal mask. In order to obtain full color display, alignment of a mask is preferably performed per emission color (R, G, and B).

Alternatively, full color display can be obtained by using a material exhibiting a monochromatic emission as the layer containing an organic compound 330, and combining a color filter or color conversion layer without being coated separately.

Subsequently, a second electrode 332 is formed. The second electrode 332 serving as an anode of the light-emitting element is formed using a transparent conductive film, which can transmit a light, for example, by ITO, ITSO, or mixture of indium oxide mixed with zinc oxide (ZnO). The light-emitting element has the structure in which the layer containing an organic compound 330 is interposed between the first electrode and the second electrode. Note that a material for the first electrode and the second electrode should be selected in consideration of a work function. Either the first electrode or the second electrode is capable of being an anode or a cathode according to a pixel structure.

In addition, a protective layer for protecting the second electrode 332 may be formed.

Next, a sealing substrate 334 is attached by a sealant (not shown) to seal the light-emitting element. Note that the region surrounded by the sealant is filled with a transparent filler 333. The filler 333 is not particularly limited. Any material can be used as long as it a light-transmitting material, and typically, ultraviolet curable or thermosetting epoxy resin is used.

Lastly, the FPC is attached to the terminal electrode by an anisotropic conductive film in accordance with a known method.

Figure 9:
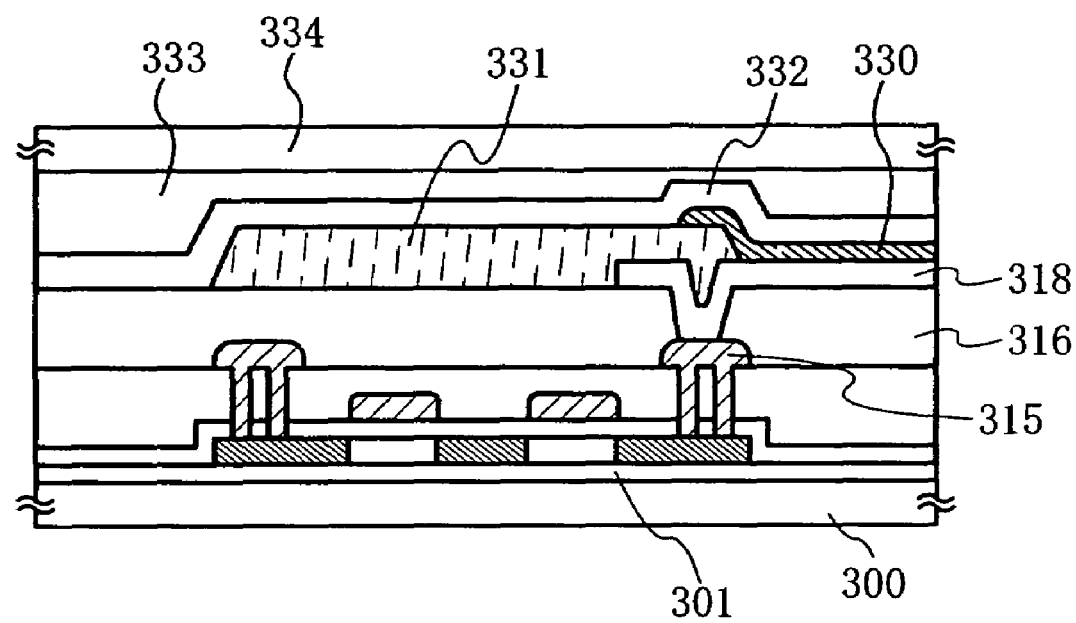
FIG. 9 is a cross-sectional view showing a structure of an active matrix EL display device (Embodiment Mode 6)

According to the foregoing processes, an active matrix light-emitting device as shown in FIG. 9 can be manufactured.

In addition, this embodiment mode can be arbitrarily combined with Embodiment Mode 1, Embodiment Mode 2, Embodiment Mode 3, Embodiment Mode 4, or Embodiment Mode 5.

Embodiments of the present invention composed of the foregoing aspects are described in further detail below.

Embodiment 1

In this embodiment, a step of forming a multilayer wiring over a semiconductor substrate will be explained with reference to FIGS. 12A to 12D.

Figure 12A:
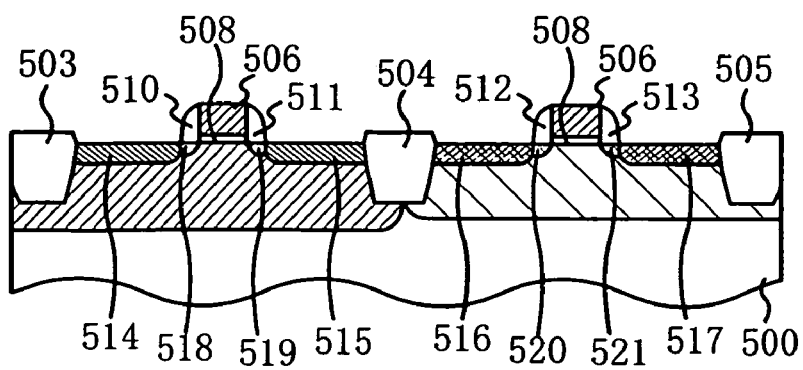
FIGS. 12A to 12D are cross-sectional views showing a method for manufacturing a semiconductor device (Embodiment 1)

First, a semiconductor substrate 500 made of single crystal silicon is prepared (FIG. 12A). The semiconductor substrate 500 is a single crystal silicon substrate or a compound semiconductor substrate, and typically, an N-type or a P-type single crystal silicon substrate, a GaAs substrate, an InP substrate, a GaN substrate, an SiC substrate, a sapphire substrate, or a ZnSe substrate.

Next, an n-well is selectively formed in a first element-forming region in a main surface (also referred to as an element-forming surface or a circuit-forming surface) of the silicon substrate and a p-well is selectively formed in a second element-forming region in the same surface, respectively.

Then, field oxide films 503, 504, and 505 to be element-isolating regions for partitioning the first element-forming region and the second element-forming region are formed. The field oxide films 503, 504, and 505 are thick thermal oxide films and may be formed by a known LOCOS method. Note that the element-isolating method is not limited to the LOCOS method. For example, the element-isolating region may have a trench structure by using a trench-isolating method, or the LOCOS structure and the trench structure may be combined.

Subsequently, a gate insulating film is formed by, for example, thermally oxidizing the surface of the silicon substrate. The gate insulating film may also be formed using a CVD method. A silicon oxynitride film, a silicon oxide film, a silicon nitride film, or a stack thereof may be used. For example, a film stack of a silicon oxide film with a thickness of 5 nm which is obtained by thermal oxidation and a silicon oxynitride film with a thickness of 10 nm to 15 nm which is obtained by a CVD method is formed.

Next, a film stack of a polysilicon layer and a silicide layer are formed over the entire surface, and the film stack is patterned by a lithography technique and a dry etching technique so as to form a gate electrode 506 having a polycide structure over the gate insulating film. The polysilicon layer may be doped with phosphorus (P) at a concentration of approximately $10^{21}/cm^3$ in advance in order to reduce the resistance. Alternatively, high concentration n-type impurities may be diffused after forming the polysilicon layer. Further, the silicide layer is preferably formed of a material such as molybdenum silicide ($MoSi_x$), tungsten silicide ($WSi_x$), tantalum silicide ($TaSi_x$), or titanium silicide ($TiSi_x$) using a known method.

Then, the gate insulating film is selectively removed. Accordingly, a gate insulating film 508 having a width of the gate electrode is formed.

Subsequently, sidewalls 510 to 513 are formed on the side walls of the gate electrode. For example, an insulating material layer formed of silicon oxide may be deposited over the entire surface by a CVD method and the insulating material layer is preferably etched back to form the sidewalls.

Next, an ion implantation is performed into the exposed silicon substrate to form a source region and a drain region. Since this is the case of manufacturing a CMOS, the first element-forming region for forming a p-channel FET is coated with a resist material, and arsenic (As) or phosphorus (P) which is an n-type impurity is injected into the silicon substrate to form a source region 514 and a drain region 515. At the same time, low-concentration impurity regions 518 and 519 added with an n-type impurity by passing through the sidewalls are formed. In addition, the second element-forming region for forming an n-channel FET is coated with a resist material, and boron (B) which is a p-type impurity is injected into the silicon substrate to form a source region 516 and a drain region 517. At the same time, low-concentration impurity regions 520 and 521 added with a p-type impurity by passing through the sidewalls are formed.

Then, activation treatment is performed using a GRTA method, an LRTA method, or the like in order to activate the ion-implanted impurities and to reduce crystal defects in the silicon substrate, which is generated by the ion implantation (see FIG. 12A).

Figure 12B:
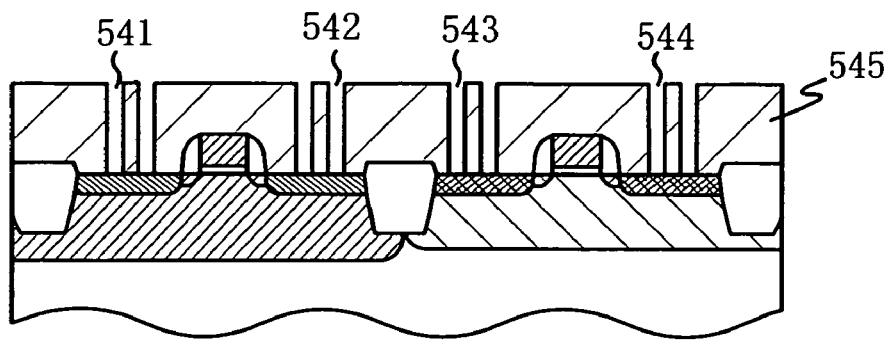

Subsequently, as shown in FIG. 12B, a first interlayer insulating film 545 is formed. The first interlayer insulating film 545 is formed in a thickness of 100 nm to 2000 nm with a silicon oxide film, a silicon oxynitride film, or the like by a plasma CVD method or a low-pressure CVD method. Further, an interlayer insulating film formed of phosphosilicate glass (PSG), borosilicate glass (BSG), or borophosphosilicate glass (PBSG) may be stacked thereover.

Next, as shown in FIG. 12B, penetrating openings 541 to 544 are formed by irradiation of laser light emitted from an ultrashort pulsed laser. This is a method for forming an opening according to the present invention shown in Embodiment Mode 1.

Figure 12C:
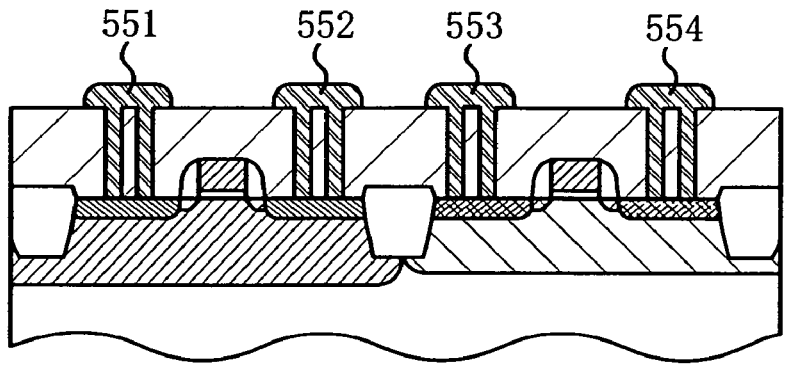

Then, as shown in FIG. 12C, conductive films 551 to 554 are formed by discharging and baking a composition containing conductive particles to the openings by a droplet discharging method. According to the present invention, a depression is not generated in portions overlapping with the openings; thus, top surfaces of the conductive films 551 to 554 are almost in one plane.

Figure 12D:
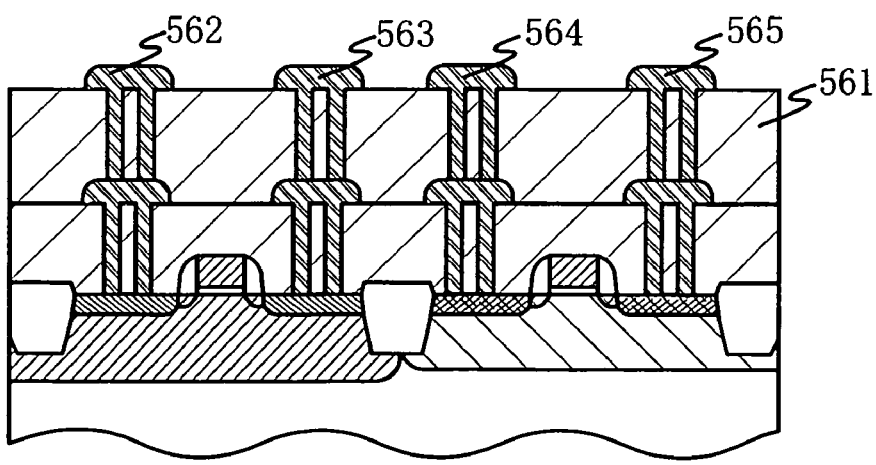

Thereafter, a second interlayer insulating film 561 is formed. Then, openings and conductive films 562 to 565 are formed in the same manner, and multilayer wirings can be formed as shown in FIG. 12D. Since the top surfaces of the conductive films 551 to 554 are almost in one plane, the depth of each of the openings penetrating through the second interlayer insulating film 561 can be kept uniform.

In addition, an SOI substrate is used as the semiconductor substrate 500 and treatment in which a circuit having a MOS transistor can be peeled at an interface with an oxidized insulating film or in the layer thereof or at an interface between the oxidized insulating film and a silicon substrate or at an interface between the oxidized insulating film and the circuit is performed. Therefore, the circuit having a MOS transistor can be peeled. In addition, a thinner film of a semiconductor device can be obtained by attaching the peeled circuit having a MOS transistor to a flexible substrate.

In addition, the semiconductor device shown in this embodiment is applicable to various semiconductor devices such as a bipolar transistor as well as a MOS transistor. Moreover, the semiconductor device is also applicable to an electric circuit such as a memory circuit or a logic circuit.

An IC chip in which an FET manufactured according to this embodiment is integrated can be used as a thin film integrated circuit or a non-contact thin film integrated circuit device (also referred to as a wireless IC tag or RFID (Radio Frequency Identification)).

Figure 13:
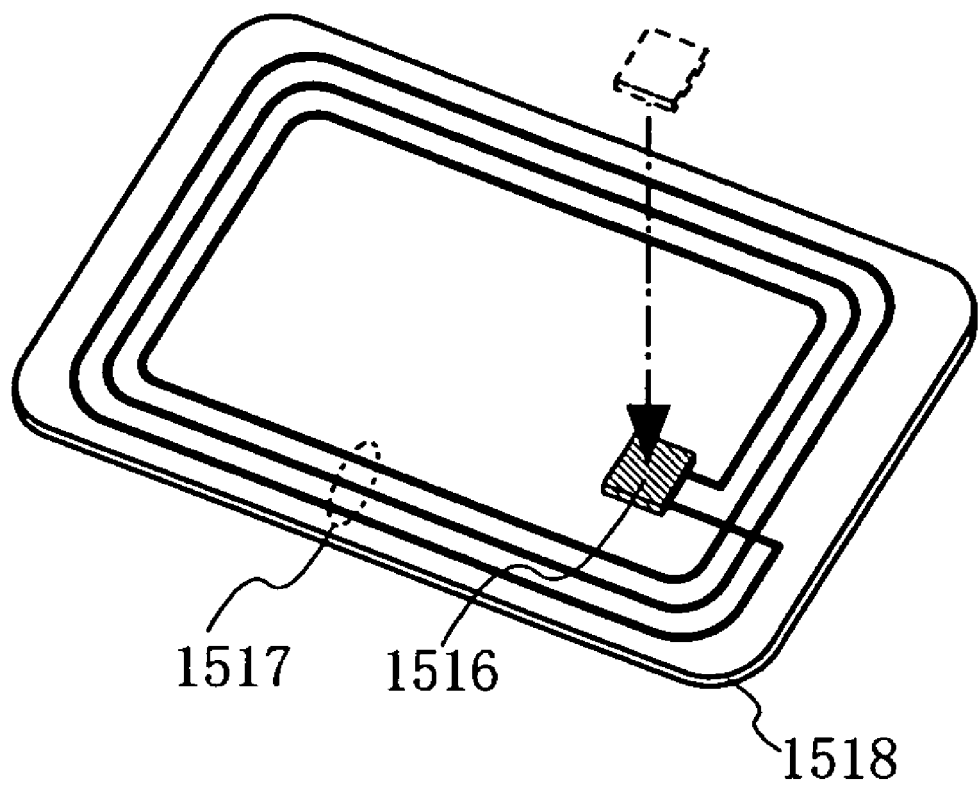
FIG. 13 is a perspective view of a semiconductor device (Embodiment 1)

FIG. 13 shows an example of an ID card in which an IC chip 1516 according to the present invention is attached to a card-like substrate 1518 provided with a conductive layer 1517 serving as an antenna. The conductive layer 1517 serving as an antenna can also be formed by a droplet discharging method. In addition, a contact hole with a connection electrode connected to the conductive layer 1517 serving as an antenna may be formed using a technique for forming an opening by using laser light. Thus, the IC chip 1516 according to the present invention is small, thin, and lightweight, so that diverse uses can be realized and the design of an article is not spoiled even when the IC chip is attached to the article.

Note that the IC chip 1516 according to the present invention is not limited to the case of being attached to the card-like substrate 1518, and can be attached to an article having a curved surface or various shapes. For example, the IC chips can be used in bill, money, coin, securities, bearer bonds, certificates (such as a driver's license, or a resident's card, packing cases (such as a wrapper or a bottle), memory media (such as a DVD, a video tape), vehicles (such as a bicycle), belongings (such as a bag, or glasses), food, clothing, commodities, and the like.

In addition, this embodiment can be arbitrarily combined with Embodiment Mode 1, Embodiment Mode 2, Embodiment Mode 3, Embodiment Mode 4, Embodiment Mode 5, or Embodiment Mode 6.

Embodiment 2

Figure 14:
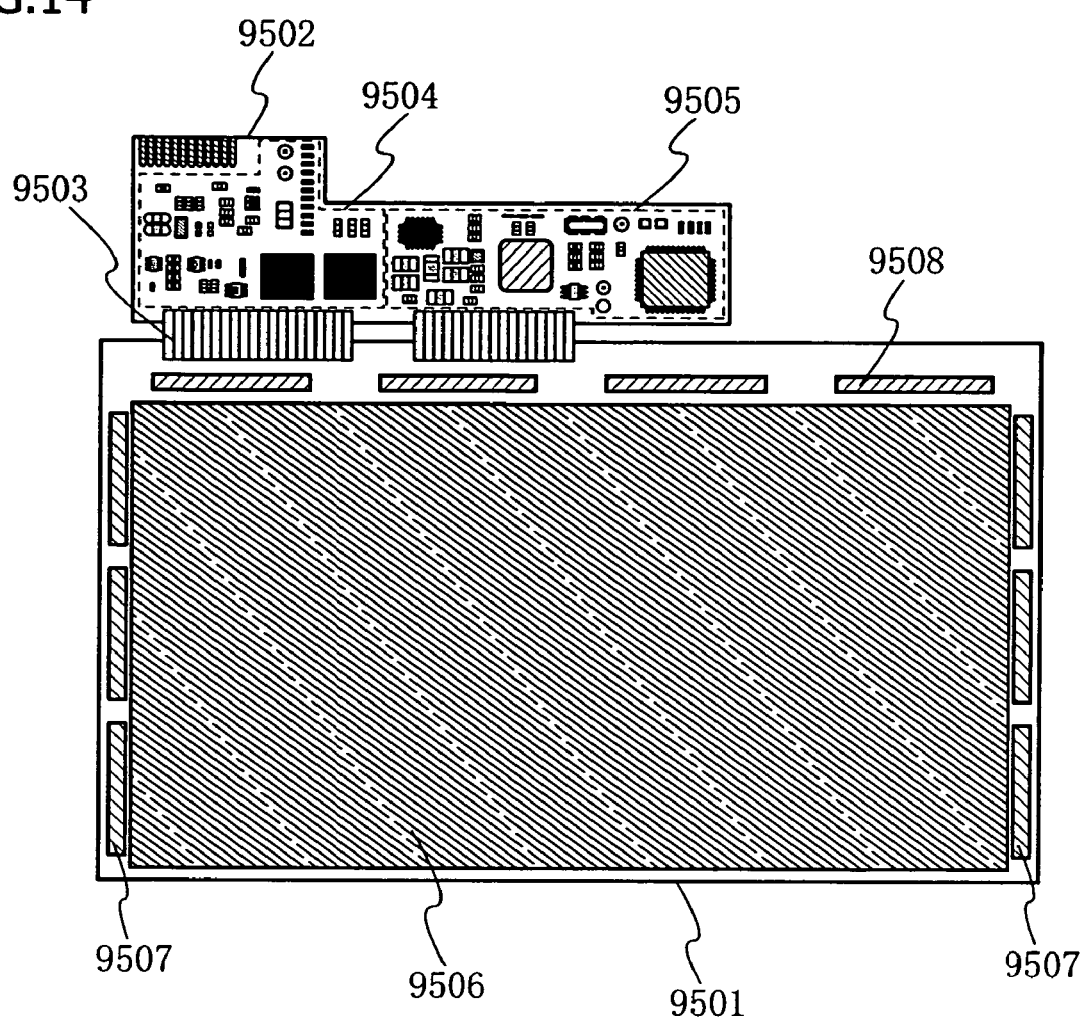
FIG. 14 is a top view showing a module (Embodiment 2)

In this embodiment, a module having the display panel shown in the above Embodiment Mode 5 or Embodiment Mode 6 will be explained with reference to FIG. 14. FIG. 14 shows a module including a display panel 9501 and a circuit board 9502. For example, a control circuit 9504, a signal division circuit 9505, and the like are mounted on the circuit board 9502. In addition, the display panel 9501 is connected to the circuit board 9502 through a connecting wire 9503. As for the display panel 9501, the liquid crystal panel or the light-emitting display panel shown in Embodiment Mode 5 or Embodiment Mode 6 may be arbitrarily used.

The display panel 9501 has a pixel portion 9506 where a light-emitting element is provided in each pixel, a scanning-line driver circuit 9507, and a signal-line driver circuit 9508 that supplies a video signal to a selected pixel. The pixel portion 9506 has the same structure as that shown in Embodiment Mode 5 or Embodiment Mode 6. As for the scanning-line driver circuit 9507 and the signal-line driver circuit 9508, IC chips are mounted on the substrate by a known mounting method such as a method using an anisotropic conductive adhesive or an anisotropic conductive film, a COG method, a wire bonding method, reflow treatment using a solder bump, or the like.

This embodiment allows a display module to be formed at low cost.

In addition, this embodiment can be arbitrarily combined with Embodiment Mode 1, Embodiment Mode 2, Embodiment Mode 3, Embodiment Mode 4, Embodiment Mode 5, Embodiment Mode 6, or Embodiment 1.

Embodiment 3

Although a liquid crystal display module and a light-emitting display module are shown as an example of the display module in the above embodiment, the present invention is not limited thereto. The present invention can be appropriately applied in forming an opening and wiring of a display module such as a DMD (Digital Micro mirror Device), a PDP (Plasma Display Panel), an FED (Field Emission Display), an electrophoretic display device (electronic paper), or an electro deposition image display device.

In addition, this embodiment can be arbitrarily combined with Embodiment Mode 1, Embodiment Mode 2, Embodiment Mode 3, Embodiment Mode 4, Embodiment Mode 5, or Embodiment Mode 6.

Embodiment 4

The semiconductor device shown in the above embodiment modes and embodiments may be applied to electronic apparatuses such as a television set (also simply referred to as a television or a television receiver). Here, a specific example of a television set will be explained with reference to FIGS. 15A and 15B.

Figure 15A:
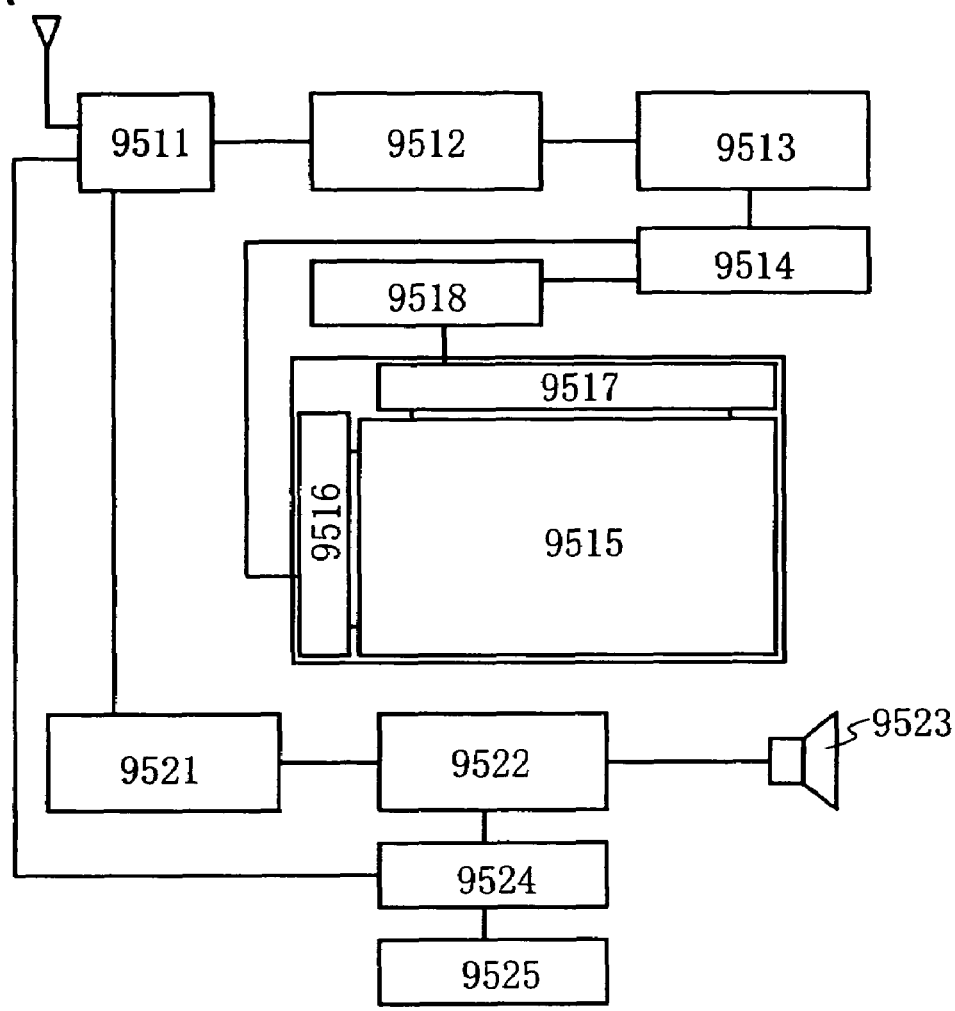
FIGS. 15A and 15B are a block diagram and a perspective view of a television device (Embodiment 4)
Figure 15B:
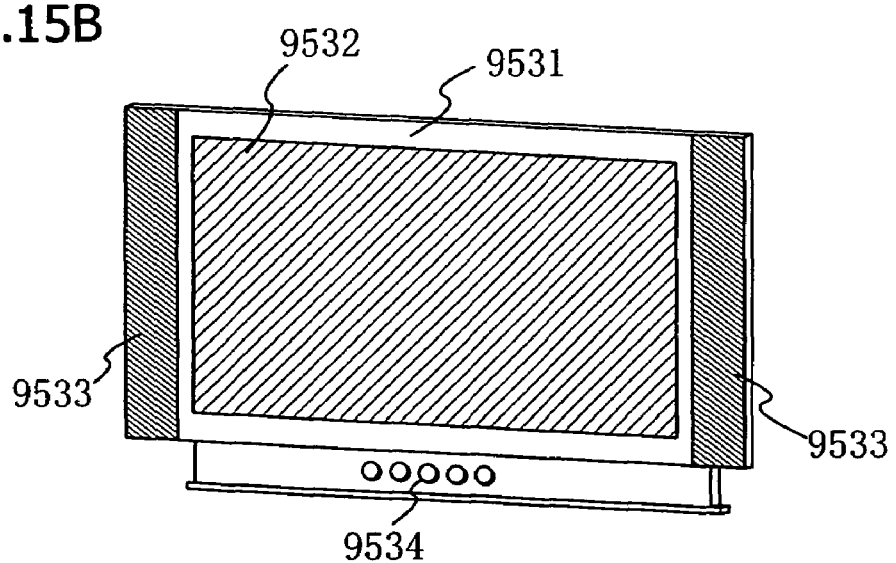

FIG. 15A shows a block diagram of a television set, while FIG. 15B shows a perspective view of a television set. A liquid crystal television set and an EL television set can be completed by using the liquid crystal module and the EL module that are shown in the above embodiments.

FIG. 15A is a block diagram showing main components of a television set. A tuner 9511 receives a video signal and an audio signal. The video signal is processed by an image detection circuit 9512, a video signal processing circuit 9513 that converts a signal outputted from the image detection circuit into a color signal corresponding to each of red, green, and blue, and a control circuit 9514 that converts the video signal in accordance with input specifications of a driver IC. The control circuit 9514 outputs a signal to a scanning-line driver circuit 9516 and a signal-line driver circuit 9517 of a display panel 9515. In the case of digital driving, a signal division circuit 9518 may be provided on the signal line side, so that an inputted digital signal is divided into m signals to be supplied.

Among signals received by the tuner 9511, an audio signal is transmitted to a sound detection circuit 9521, and an output thereof is supplied to a speaker 9523 through an audio signal processing circuit 9522. A control circuit 9524 receives control information of a receiving station (received frequency) and a sound volume from an input portion 9525, and transmits signals to the tuner 9511 and the audio signal processing circuit 9522.

As shown in FIG. 15B, a television set can be completed by incorporating a module in a housing 9531. A display screen 9532 is formed using a module typified by a liquid crystal module and an EL module. In addition, the television set also includes a speaker 9533, operating switches 9534, and the like.

Since this television set includes the display panel 9515, cost reduction thereof can be achieved. In addition, the television set with high definition can be provided.

The application of the present invention is not limited to the television receiver, and various applications are possible, such as a monitor for a personal computer as well as, in particular, a display medium with a large area such as an information display panel at stations or airports, and an advertisement display panel on the street.

In addition, this embodiment can be arbitrarily combined with Embodiment Mode 1, Embodiment Mode 2, Embodiment Mode 3, Embodiment Mode 4, Embodiment Mode 5, or Embodiment Mode 6.

Embodiment 5

A semiconductor device and an electronic device according to the present invention include a camera such as a video camera or a digital camera, a goggle type display (head mounted display), a navigation system, an audio player (a car audio, an audio component, and the like), a personal computer, a game machine, a portable information terminal (a mobile computer, a cellular phone, a portable game machine, an electronic book, and the like), an image reproducing device provided with a recording medium (specifically a device capable of reproducing the content of a recording medium such as a Digital Versatile Disc (DVD) and that has a display device capable of displaying the image), and the like. Specific examples of the electronic devices are shown in FIGS. 16A to 16E.

Figure 16A:
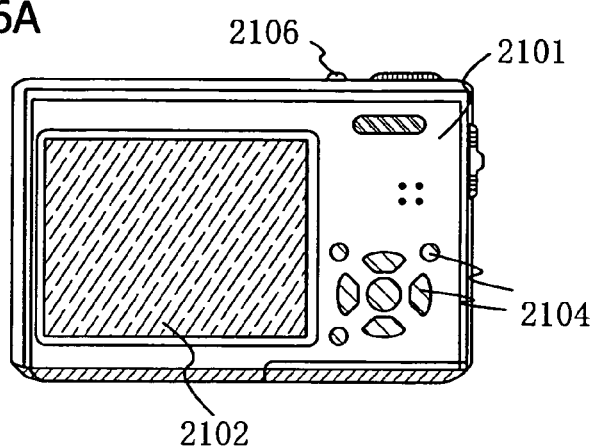
FIGS. 16A to 16E are views each showing one example of an electronic device (Embodiment 5)

FIG. 16A is a digital camera, which includes a main body 2101, a display portion 2102, an imaging portion, operation keys 2104, a shutter 2106, and the like. Note that FIG. 16A is viewed from the side of the display portion 2102 and the imaging portion is not shown. According to the present invention, the digital camera can be obtained through a process where the manufacturing cost is reduced.

Figure 16B:
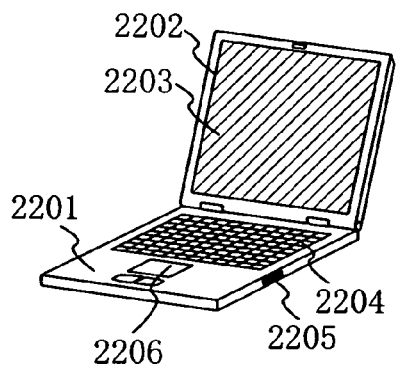

FIG. 16B is a personal computer, which includes a main body 2201, a housing 2202, a display portion 2203, a keyboard 2204, an external connection port 2205, a pointing mouse 2206, and the like. According to the present invention, the personal computer can be obtained through a process where the manufacturing cost is reduced.

Figure 16C:
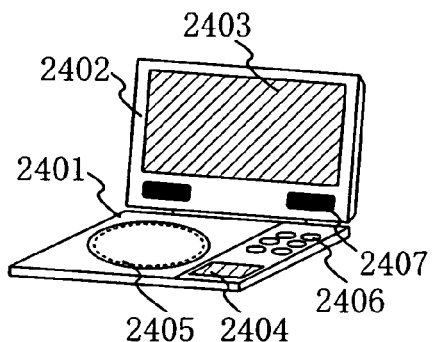

FIG. 16C is a mobile image reproducing device provided with a recording medium (specifically, a DVD player), which includes a main body 2401, a housing 2402, a display portion A 2403, a display portion B 2404, a recording medium (DVD or the like) reading portion 2405, operation keys 2406, a speaker portion 2407, and the like. The display portion A 2403 is used mainly for displaying image information, whereas the display portion B 2404 is used mainly for displaying text information. Note that the image reproducing device provided with a recording medium also includes a home-use game machine or the like. According to the present invention, the image reproducing device can be obtained through a process where the manufacturing cost is reduced.

Figure 16D:
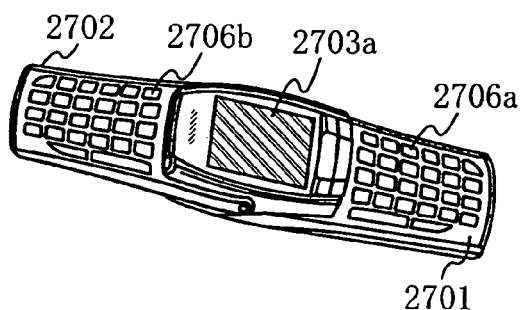
Figure 16E:
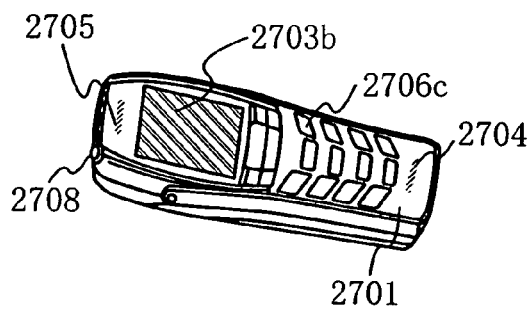

In addition, FIG. 16D is a perspective view of a portable information terminal, and FIG. 16E is a perspective view showing a state of using it as a folding cellular phone. In FIG. 16D, users operate operation keys 2706a with their right fingers and operate operation keys 2706b with their left fingers when they are used as a keyboard. According to the present invention, the portable information terminal can be obtained through a process where a manufacturing cost is reduced.

As shown in FIG. 16E, in folding a cellular phone, users have a main body 2701 and a housing 2702 in one hand and use an audio input portion 2704, an audio output portion 2705, operation keys 2706c, an antenna 2708, and the like.

The portable information terminals shown in FIGS. 16D and 16E each includes a high-definition display portion 2703a which horizontally displays images and characters mainly and a display portion 2703b which vertically displays.

As described above, various electronic devices can be completed by employing a manufacturing method or a structure according to the present invention, that is, any one of Embodiment Modes 1, Embodiment Mode 2, Embodiment Mode 3, Embodiment Mode 4, Embodiment Mode 5, Embodiment Mode 6, and Embodiments 1 to 4.

Embodiment 6

According to the present invention, a semiconductor device serving as a wireless chip (also called a wireless processor, a wireless memory, or a wireless tag) can be manufactured.

An example of mounting a chip obtained by cutting a semiconductor substrate on a card having an antenna is shown in Embodiment 1; however, a wireless chip can also be formed using a TFT.

Figure 17:
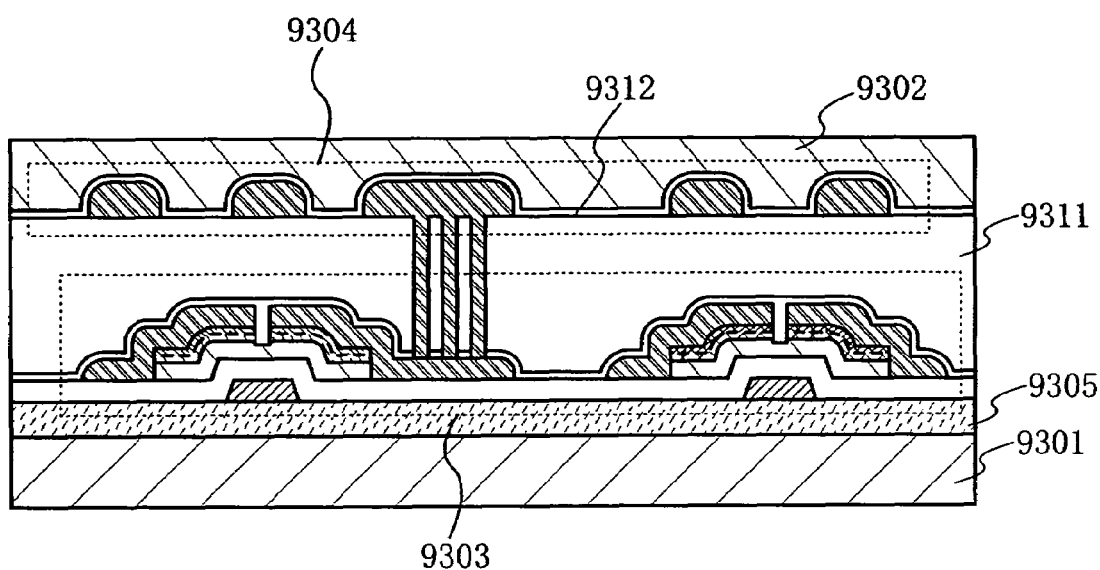
FIG. 17 is one example of a cross-sectional view showing a structure according to the present invention (Embodiment 6)

A structure of a wireless chip according to the present invention will be explained with reference to FIG. 17. A wireless chip is constituted by a thin film integrated circuit 9303 and an antenna 9304 connected thereto. The thin film integrated circuit 9303 and the antenna 9304 are sandwiched between cover materials 9301 and 9302. The thin film integrated circuit 9303 may be attached to the cover materials with an adhesive. In FIG. 17, one surface of the thin film integrated circuit 9303 is attached to the cover material 9301 with an adhesive 9305.

The thin film integrated circuit 9303 is formed using a TFT shown in Embodiment Mode 5 or Embodiment Mode 6, then peeled off by a known peeling step and attached to a cover material. In addition, the semiconductor element used for the thin film integrated circuit 9303 is not limited thereto, and in addition to the TFT, a memory element, a diode, a photoelectric converter, a resistor, a coil, a capacitor, an inductor, or the like may be used.

As shown in FIG. 17, an interlayer insulating film 9311 is formed over the TFT of the thin film integrated circuit 9303, and the antenna 9304 is connected to the TFT through the interlayer insulating film 9311. In addition, a barrier film 9312 made of silicon nitride or the like is formed over the interlayer insulating film 9311 and the antenna 9304.

The antenna 9304 is formed by discharging a droplet containing a conductor such as gold, silver and copper by a droplet discharging method, then baking and drying it. When the antenna is formed by a droplet discharging method, reduction in the number of steps can be realized, leading to cost reduction.

Each of the cover materials 9301 and 9302 preferably uses a film (made of polypropylene, polyester, vinyl, polyvinyl fluoride, vinyl chloride, or the like), paper of a fibrous material, a film where a base film (polyester, polyamide, an inorganic vapor deposition film, papers, or the like), and an adhesive synthetic resin film (an acrylic based synthetic resin, an epoxy based synthetic resin, or the like) are stacked, or the like. The film is obtained by performing sealing treatment to the subject by thermocompression. In the sealing treatment, an adhesive layer formed on the uppermost surface of the film or a layer (not an adhesive layer) formed on the outermost layer is melted by heat treatment to adhere by applying pressure.

When the cover materials use a flammable pollution-free material such as paper, fiber and carbon graphite, the used wireless chip can be burned or cut out. In addition, the wireless chip using such a material is pollution free because it does not generate poison gas even if being burned.

Although the wireless chip is attached to the cover material 9301 with the adhesive 9305 in FIG. 17, the wireless chip may be attached to the object instead of the cover material 9301.

Figure 18A:
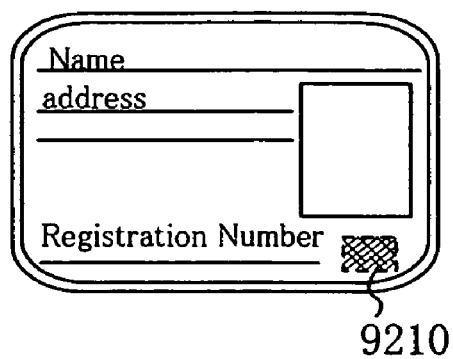
FIGS. 18A to 18F are perspective views explaining application examples of a semiconductor device (Embodiment 6)
Figure 18B:
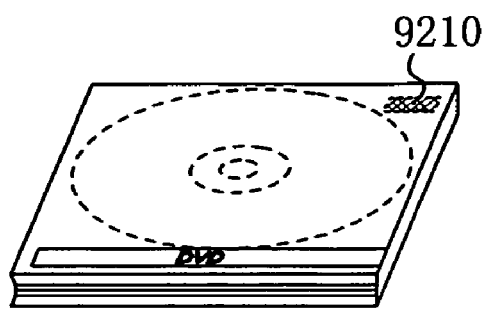
Figure 18C:
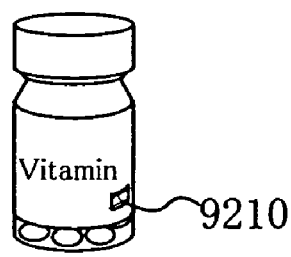
Figure 18D:
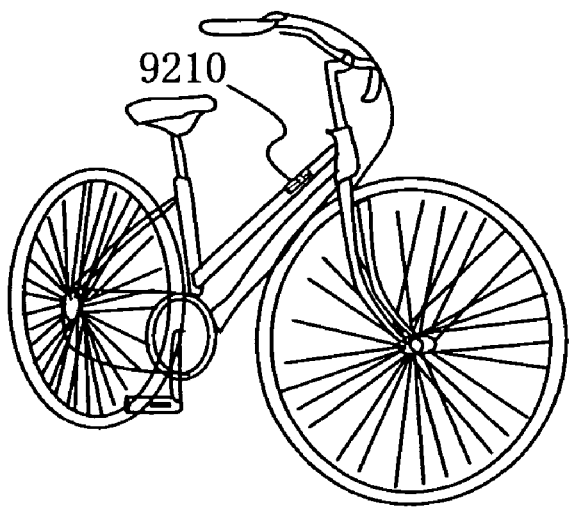
Figure 18E:
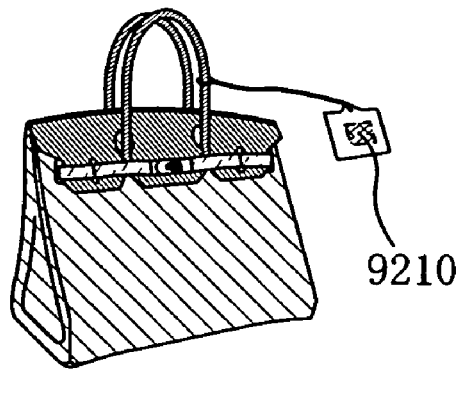
Figure 18F:
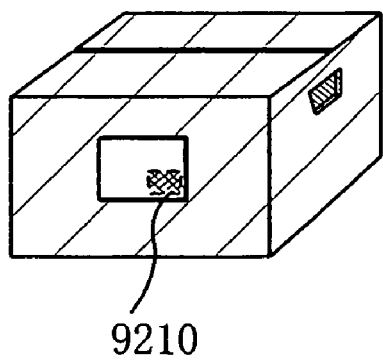
Figure 19A:
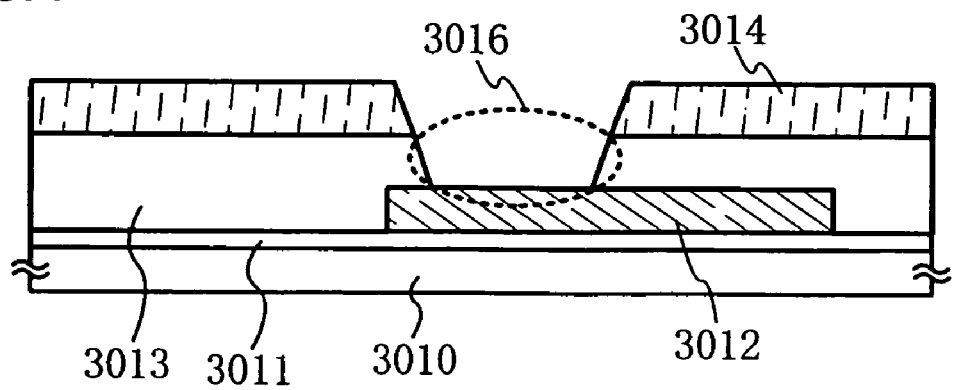
FIGS. 19A to 19C are cross-sectional views showing a conventional example.
Figure 19B:
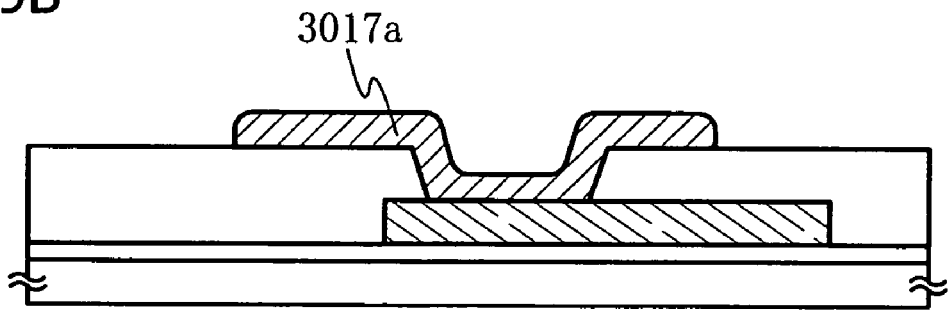
Figure 19C:
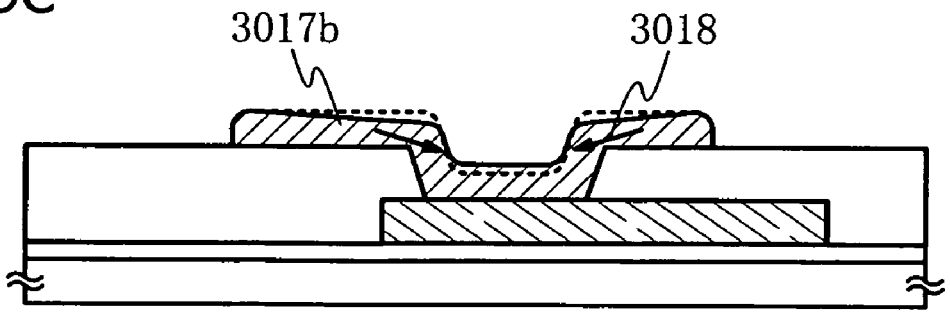

The wireless chip 9210 may be mounted on various objects and one example is shown in FIG. 18A to 18, for example, such as bills, coins, securities, bearer bonds, certificates (licenses, resident cards and the like, see FIG. 18A), containers for wrapping objects (wrapping papers, bottles and the like, see FIG. 18C), recording media (DVDs, video tapes and the like, see FIG. 18B), vehicles (bicycles and the like, see FIG. 18D), belongings (bags, glasses and the like), foods, plants, animals, human body, clothes, living ware, and electronic apparatuses, or shipping tags of objects (see FIGS. 18E and 18F). The electronic apparatuses include liquid crystal display devices, EL display devices, television sets (also simply called televisions or television receivers), cellular phones, and the like.

A wireless chip is attached to the surface of the object or incorporated in the object to be fixed. For example, a wireless chip is preferably incorporated in a paper of a book, or an organic resin of a package. When a wireless chip is incorporated in bills, coins, securities, bearer bonds, certificates, and the like, forgery thereof can be prevented. In addition, when a wireless chip is incorporated in containers for wrapping objects, recording media, belongings, foods, clothes, living ware, electronic apparatuses, and the like, test systems, rental systems, and the like can be performed more efficiently. A wireless chip according to the present invention is obtained in such a manner that a thin film integrated circuit formed over a substrate is peeled off by a known peeling step and then attached to a cover material; therefore, the wireless chip can be reduced in size, thickness and weight and can be mounted on an object while keeping the attractive design. In addition, since such a wireless chip has flexibility, the wireless chip can be attached to an object having a curved surface, such as bottles and pipes.

When a wireless chip according to the present invention is applied to product management and distribution system, high performance system can be achieved. For example, when information stored in a wireless chip mounted on a shipping tag is read by a reader/writer provided beside a conveyor belt, information such as distribution process and delivery address is read to easily inspect and distribute the object.

In addition, this embodiment can be arbitrarily combined with Embodiment Mode 1, Embodiment Mode 2, Embodiment Mode 3, Embodiment Mode 4, Embodiment Mode 5, Embodiment Mode 6, or Embodiment 1.

According to the present invention, since the number of etching steps accompanying a photolithography method can be reduced, the loss and effluent amount of a material solution can be reduced. In addition, the present invention can realize a manufacturing process with the use of a droplet discharging method suitable for manufacturing a large-sized substrate in mass production.

The present application is based on Japanese Patent Application serial No. 2005-014756 filed on Jan. 21, 2005 in Japanese Patent Office, the contents of which are hereby incorporated by reference.

What is claimed is:

1. A method for manufacturing a semiconductor device comprising the steps of:
   forming a first insulating film over a semiconductor substrate;
   forming a second insulating film over the first insulating film;
   forming a first opening that reaches the first insulating film in the second insulating film by irradiating the second insulating film with laser light and a second opening that reaches the semiconductor substrate in the first insulating film and the second insulating film by irradiating the first insulating film and the second insulating film with laser light; and
   forming a gate electrode through the first opening and an electrode through the second opening by a droplet discharging method or a printing method, wherein the gate electrode is in contact with the first insulating film, and wherein the electrode is in contact with the semiconductor substrate.

2. A method according to claim 1, wherein a diameter of each of the first opening and the second opening is 3 nm or more and 2000 nm or less.

3. A method according to claim 1, wherein the first opening and the second opening are a columnar shape, an L shape, a U shape, or a shape drawing an arc.

4. A method according to claim 1, wherein the first opening and the second opening are formed by moving a focal position of the laser light to an X direction, a Y direction, or a Z direction.

5. A method according to claim 1, wherein the laser light is oscillated with a pulse width of the laser light being 1 femtosecond or more and 10 picoseconds or less.

6. A method according to claim 1, wherein the laser light has a fundamental wave emitted from a laser oscillator of which laser repetition frequency is 10 MHz or more.

7. A method for manufacturing a semiconductor device comprising the steps of:
   forming a semiconductor layer over a substrate;
   forming a first insulating film over the semiconductor layer;
   forming a second insulating film over the first insulating film;
   forming a first opening that reaches the first insulating film in the second insulating film by irradiating the second insulating film with laser light and a second opening that reaches the semiconductor layer in the first insulating film and the second insulating film by irradiating the first insulating film and the second insulating film with laser light; and
   forming a gate electrode through the first opening and an electrode through the second opening by a droplet discharging method or a printing method, wherein the gate electrode is in contact with the first insulating film, and wherein the electrode is in contact with the semiconductor layer.

8. A method according to claim 7, wherein a diameter of each of the first opening and the second opening is 3 nm or more and 2000 nm or less.

9. A method according to claim 7, wherein the first opening and the second opening, are a columnar shape, an L shape, a U shape, or a shape drawing an arc.

10. A method according to claim 7, wherein the first opening and the second opening are formed by moving a focal position of the laser light to an X direction, a Y direction, or a Z direction.

11. A method according to claim 7, wherein the laser light is oscillated with a pulse width of the laser light being 1 femtosecond or more and 10 picoseconds or less.

12. A method according to claim 7, wherein the laser light has a fundamental wave emitted from a laser oscillator of which laser repetition frequency is 10 MHz or more.

* * * * *

UNITED STATES PATENT AND TRADEMARK OFFICE
CERTIFICATE OF CORRECTION

PATENT NO. : 7,579,224 B2 Page 1 of 1
APPLICATION NO. : 11/329095
DATED : August 25, 2009
INVENTOR(S) : Kuwabara et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 366 days.

Signed and Sealed this

Fourteenth Day of September, 2010

David J. Kappos
*Director of the United States Patent and Trademark Office*